United States Patent
Miyoshi et al.

(10) Patent No.: US 8,765,221 B2
(45) Date of Patent: Jul. 1, 2014

(54) FILM FORMING METHOD AND FILM FORMING APPARATUS

(75) Inventors: Hidenori Miyoshi, Nirasaki (JP); Hitoshi Itoh, Nirasaki (JP); Hiroshi Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/616,308

(22) Filed: Sep. 14, 2012

(65) Prior Publication Data

US 2013/0017328 A1  Jan. 17, 2013

Related U.S. Application Data

(63) Continuation of application No. PCT/JP2011/055480, filed on Mar. 9, 2011.

(30) Foreign Application Priority Data

Mar. 16, 2010 (JP) ................................. 2010-058592
Feb. 4, 2011 (JP) ................................. 2011-023031

(51) Int. Cl.
   *C23C 16/40* (2006.01)
(52) U.S. Cl.
   USPC .............. 427/255.31; 427/248.1; 427/255.28; 427/255.29; 427/299; 427/419.2; 427/419.3
(58) Field of Classification Search
   USPC ......... 427/248.1, 255.28, 299, 255.31, 419.2, 427/419.3
   See application file for complete search history.

(56) References Cited

U.S. PATENT DOCUMENTS

| | | | |
|---|---|---|---|
| 6,413,583 B1 * | 7/2002 | Moghadam et al. | 427/249.15 |
| 7,456,490 B2 * | 11/2008 | Kloster et al. | 257/642 |
| 2002/0182343 A1 * | 12/2002 | Yuda et al. | 427/569 |
| 2003/0064607 A1 * | 4/2003 | Leu et al. | 438/780 |
| 2006/0127578 A1 * | 6/2006 | Lei et al. | 427/255.31 |
| 2007/0049024 A1 * | 3/2007 | Nakao et al. | 438/687 |

FOREIGN PATENT DOCUMENTS

| | | |
|---|---|---|
| CN | 1821251 A | 8/2006 |
| JP | 2005-277390 | 10/2005 |
| JP | 2009-016782 | 1/2009 |
| JP | 2011-023706 | 2/2011 |

OTHER PUBLICATIONS

International Search Report issued May 31, 2011, in PCT/JP2011/055480 filed Mar. 9, 2011.
Office Action dated Oct. 29, 2013, in corresponding Korean Application No. 10-2012-7027017.

* cited by examiner

*Primary Examiner* — Elizabeth Burkhart
(74) *Attorney, Agent, or Firm* — Oblon, Spivak, McClelland, Maier & Neustadt, L.L.P.

(57) ABSTRACT

A film forming method includes a step of arranging a wafer, on which an insulating film is formed, in a processing chamber of a film forming apparatus and a surface modification step of supplying a compound gas containing silicon atoms and an OH group-donating gas into the processing chamber so that Si—OH groups are formed on the surface of the insulating film. The film forming method further includes a film forming step of supplying a film forming gas containing a manganese-containing material into the processing chamber so that a manganese-containing film is formed on the surface of the insulating film on which the Si—OH groups have been formed through a CVD method.

20 Claims, 16 Drawing Sheets

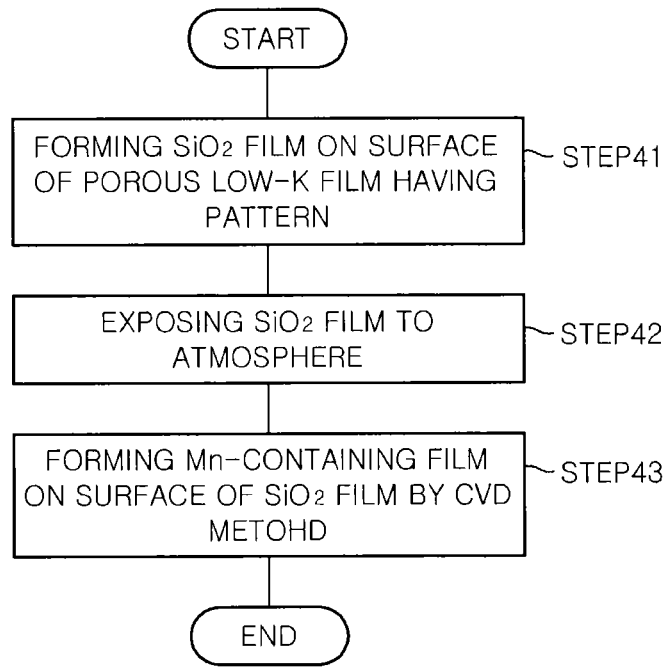
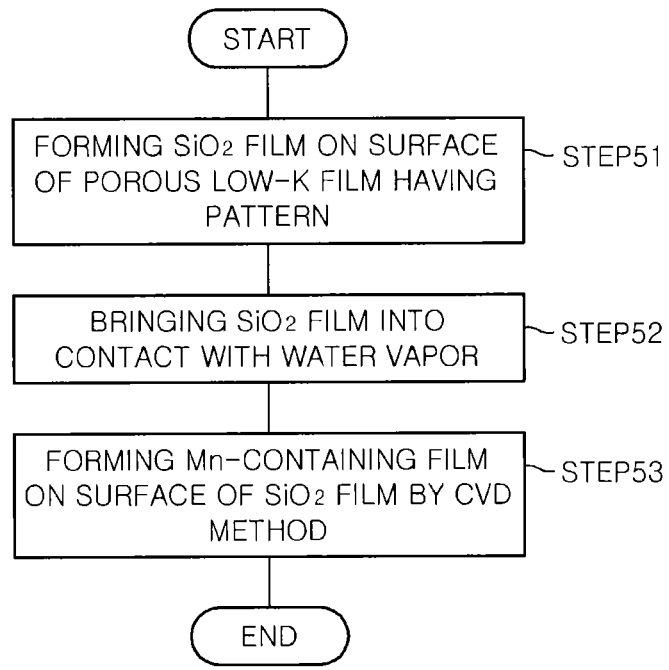

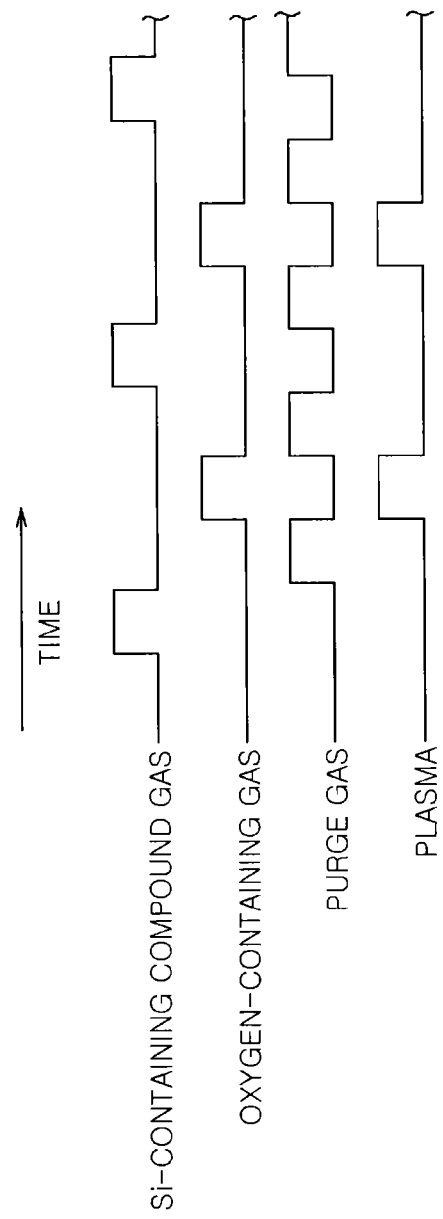

FILM FORMING METHOD AND FILM FORMING APPARATUS

This application is a Continuation Application of PCT International Application No. PCT/JP2011/055480 filed on Mar. 9, 2011, which designated the United States.

FIELD OF THE INVENTION

The present invention relates to a film forming method and a film forming apparatus for use in the film forming method.

BACKGROUND OF THE INVENTION

With a high integration of semiconductor devices and a reduction in chip size, a miniaturization of wiring and a multi-layered wiring have been developed. In the semiconductor device having a multilayer wiring structure, a propagation delay of a signal in the wiring is proportional to a product of a wire resistance R and a capacitance C between wires (RC product). Thus, in order to improve a propagation speed of the signal, it is considered to be effective to reduce the wire resistance and reduce the capacitance between wires.

In order to reduce the wire resistance R, a technique of using a low-resistivity copper as a wiring material has been put to practical use. Recently, a copper wiring is generally formed by a damascene process. When forming the copper wiring by the damascene process, the inner surface of a via hole or a wiring groove is coated with a barrier film in order to prevent a diffusion of copper atoms into an insulating film, or to prevent a diffusion of oxygen into the copper wiring from the insulating film.

As a material of the barrier film, a high melting point metal such as tantalum or tungsten has been used, but the high melting point metal has a resistivity higher than that of copper. The miniaturization of the wiring increases the proportion of the barrier film with respect to the copper wiring, making the barrier film a major factor to increase the wire resistance. Thus, in the fine multilayer wiring structure, in order to suppress the increase in the wire resistance, it is required to make the barrier film as thin as possible.

From this point of view, in recent years, as a barrier film, a manganese-containing barrier film such as manganese oxide has been attracting attention. Since the manganese-containing barrier film can be formed in a self-aligned manner by performing an annealing treatment after a thin film of manganese or an alloy of manganese is formed by a method such as a sputtering, there is an advantage that the thickness of the barrier film can be thin (e.g., Japanese Patent Application Publication No. 2005-277390). In addition, technology for forming the manganese-containing barrier film by a thermal chemical vapor deposition (CVD) method has also been proposed (e.g., Japanese Patent Application Publication No. 2009-16782).

Meanwhile, the capacitance C between wires can be reduced by forming an interlayer insulating film by using a low dielectric constant material. Further, by using the low dielectric constant material, it is possible to prevent crosstalks between wires. From this point of view, as the interlayer insulating film, a low dielectric constant film (low-k film) has been used. Moreover, the development of a porous low dielectric constant film (porous low-k film) to further reduce a parasitic capacitance by dispersing pores in the low dielectric constant film has been being pursued.

In a case where the manganese-containing barrier film is formed by a CVD method, since the manganese-containing barrier film is hardly deposited on the low dielectric constant film, there is a problem such that it is difficult to form a film thick enough to make it function as a barrier. Further, if the manganese-containing barrier film is formed on the porous low-k film by a CVD method, manganese may enter into the pores of the porous low-k film, thereby causing the diffusion of copper atoms from the copper wiring.

SUMMARY OF THE INVENTION

In view of the above, the present invention provides a method for forming a barrier film with high adhesion to a low dielectric constant film, capable of effectively preventing a diffusion of copper into the low dielectric constant film.

In accordance with a first aspect of the present invention, there is provided a film forming method including: a step of arranging an object to be processed, on which an insulating film is formed, in a processing chamber of a film forming apparatus; a surface modification step of supplying a compound gas containing silicon atoms and an OH group-donating gas, or a compound gas containing silicon atoms and OH groups into the processing chamber so that Si—OH groups are formed on a surface of the insulating film; and a film forming step of supplying a film forming gas including a manganese-containing material into the processing chamber so that a manganese-containing film is formed on the surface of the insulating film on which the Si—OH groups have been formed through a CVD method.

In the first aspect of the present invention, the compound gas containing silicon atoms and the OH group-donating gas may be supplied into the processing chamber simultaneously in the surface modification step.

Further, in the first aspect of the present invention, the compound gas containing silicon atoms and the OH group-donating gas may be supplied into the processing chamber alternately in the surface modification step.

Further, in the first aspect of the present invention, the surface modification step and the film forming step may be repeated alternately.

In accordance with a second aspect of the present invention, there is provided a film forming method including: a step of arranging an object to be processed, on which an insulating film is formed, in a processing chamber of a film forming apparatus; and a film forming step of simultaneously supplying a compound gas containing silicon atoms, an OH group-donating gas and a film forming gas including a manganese-containing material, or simultaneously supplying a compound gas containing silicon atoms and OH groups and a film forming gas including a manganese-containing material into the processing chamber so that a manganese-containing film is formed on a surface of the insulating film through a CVD method.

In the first and the second aspect of the present invention, the insulating film may be a low dielectric constant film having a predetermined irregularity pattern.

In the first and the second aspect of the present invention, the film forming method may further include a step of removing the manganese-containing film formed on a bottom wall of an opening of the low dielectric constant film having the predetermined irregularity pattern while leaving the manganese-containing film formed on a sidewall of the opening.

In the first and the second aspect of the present invention, the compound gas containing silicon atoms may be a gas including at least one selected from the group consisting of tetraethoxysilane (TEOS), tetramethoxysilane, tetra-i-propoxysilane, tetra-n-propoxysilane, tetra-i-butoxysilane, tetra-n-butoxysilane, tetra-sec-butoxysilane, tetra-tert-butoxysilane, tris(tert-butoxy)silanol, tris(tert-pentoxy)silanol, tris(isopropoxy)silanol, bis(tert-butoxy)silanediol, tetra(tert-butoxy)silane, monosilane, disilane, trisilane and tetrasilane.

In the first and the second aspect of the present invention, the OH group-donating gas may be water vapor or alcohol. Methanol, ethanol and the like may be specific examples of alcohol.

In the first and the second aspect of the present invention, the compound gas containing silicon atoms and OH groups may be a gas including at least one selected from the group consisting of tris(tert-butoxy)silanol, tris(tert-pentoxy)silanol, tris(isopropoxy)silanol and bis(tert-butoxy)silanediol.

In accordance with a third aspect of the present invention, there is provided a film forming method including: a first film forming step of forming a silicon dioxide film on a surface of a low dielectric constant film having a predetermined irregularity pattern formed on an object to be processed; and a second film forming step of forming a manganese-containing film on a surface of the silicon dioxide film through a CVD method by using a film forming gas including a manganese-containing material.

In the third aspect of the present invention, the low dielectric constant film may be a porous low dielectric constant film.

In the third aspect of the present invention, the silicon dioxide film may be formed through a plasma CVD method or a MLD method by using a film forming gas containing silicon atoms in the first film forming step.

In the third aspect of the present invention, the film forming method may further include a step of exposing the silicon dioxide film to the atmosphere to absorb moisture between the first film forming step and the second film forming step.

In the third aspect of the present invention, the film forming method may further include a step of bringing the silicon dioxide film into contact with water vapor to absorb moisture between the first film forming step and the second film forming step.

In the third aspect of the present invention, the film forming method may further include a step of removing the silicon dioxide film and the manganese-containing film formed on a bottom wall of an opening of the low dielectric constant film having the predetermined irregularity pattern while leaving the silicon dioxide film and the manganese-containing film formed on a sidewall of the opening.

In the third aspect of the present invention, a cyclopentadienyl-based precursor may be used as the manganese-containing material. In this case, the cyclopentadienyl-based precursor may be at least one selected from the group consisting of $Mn(C_5H_5)_2$, $Mn(CH_3C_5H_4)_2$, $Mn(C_2H_5C_5H_4)_2$, $Mn(C_3H_7C_5H_4)_2$, $(CH_3C_5H_4)Mn(CO)_3$, $Mn(C_4H_9C_5H_4)_2$ and $Mn((CH_3)_5C_5H_4)_2$.

In accordance with a fourth aspect of the present invention, there is provided a film forming apparatus including: an evacuable processing chamber; a mounting table provided in the processing chamber to mount an object to be processed; a heater configured to heat the object to be processed, which is mounted on the mounting table, to a predetermined temperature; and a gas supply mechanism configured to separately supply, into the processing chamber, each of a compound gas containing silicon atoms, an OH group-donating gas and a film forming gas including a manganese-containing material, or simultaneously supplies, into the processing chamber, at least two of the compound gas containing silicon atoms, the OH group-donating gas and the film forming gas including a manganese-containing material.

In accordance with the present invention, it is possible to improve the adhesion of a manganese-containing film and form the manganese-containing film of a uniform thickness with good step coverage even in an opening. Moreover, since the film forming rate of the manganese-containing film is also improved, the manganese-containing film serving as a barrier film can be formed to have a desired film thickness. By manganese-containing film formed by the method in accordance with the present invention, it is possible to suppress the diffusion of metal such as copper into the low dielectric constant film. Therefore, it is possible to reduce the wire resistance and respond to miniaturization while ensuring the reliability of the multilayer wiring structure using the low dielectric constant film as an interlayer insulating film.

BRIEF DESCRIPTION OF THE DRAWINGS

FIG. 14 is a flowchart showing a procedure of a first modification example of the film forming method in accordance with the third embodiment of the present invention.

FIG. 15 is a flowchart showing a procedure of a second modification example of the film forming method in accordance with the third embodiment of the present invention.

FIG. 17 shows an example of a timing chart of a case of forming the $SiO_2$ film by a MLD method.

DETAILED DESCRIPTION OF THE EMBODIMENTS

Figure 1:
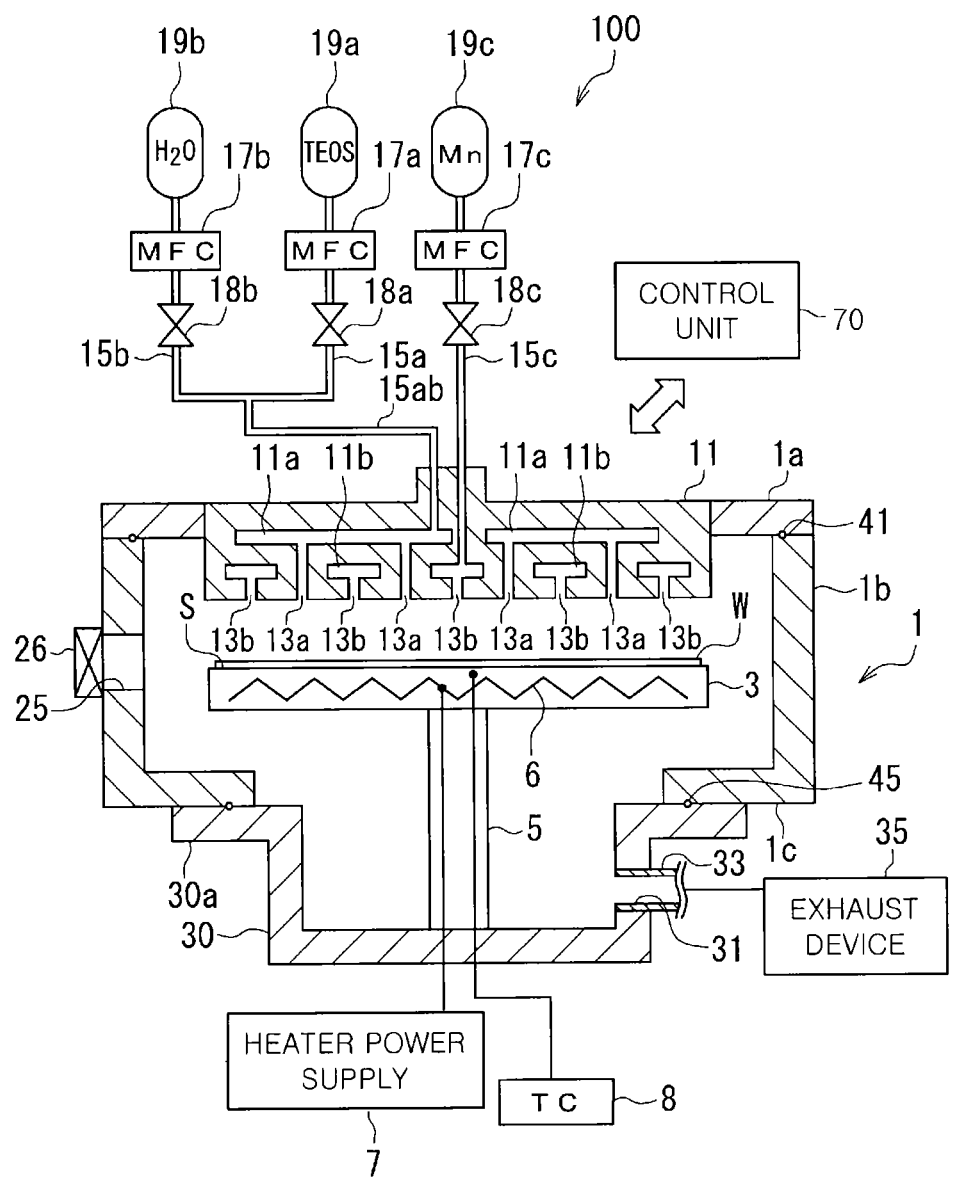
FIG. 1 shows an example of a schematic configuration of a film forming apparatus that can be used in a method of the present invention.

Hereinafter, an embodiment of the present invention will be described with reference to the accompanying drawings. First, a configuration of a film forming apparatus applicable to carry out a film forming method in accordance with the embodiment of the present invention will be described. FIG. 1 shows a schematic configuration example of a film forming apparatus 100 that is applicable to carry out the film forming method. The film forming apparatus 100 is configured as a CVD apparatus. In the film forming apparatus 100, a film forming process can be performed such that a manganese-containing barrier film is formed on an insulating film such as a low dielectric constant (low-k) film.

The film forming apparatus 100 includes a hermetically sealed processing chamber 1 of a substantially cylindrical shape. The processing chamber 1 formed of a material such as aluminum whose surface is alumite treated (anodically oxidized). In the processing chamber 1, there is provided a stage 3 that is a mounting table for horizontally supporting a semiconductor wafer (hereinafter simply referred to as "wafer") W serving as an object to be processed. The stage 3 is supported by a cylindrical support member 5. A heater 6 serving as a heating unit is embedded in the stage 3 to heat the wafer W. The heater 6 is a resistance heater which is powered by a heater power supply 7 to heat the wafer W to a predetermined temperature. Further, a thermocouple (TC) 8 serving as a temperature measurement unit is provided in the stage 3 to measure a temperature of the stage 3 in real time. In addition, a heating temperature and a processing temperature of the wafer W indicate the temperature of the stage 3 unless otherwise stated. The heating unit for heating the wafer W is not limited to the resistance heater, and, for example, a lamp heater may be used.

Further, although not shown, lift pins for supporting and moving up and down the wafer W are provided in the stage so as to protrude from and retract into a substrate mounting surface S of the stage 3. These lift pins are moved up and down by a lifting mechanism and configured such that the wafer W is delivered from/to a transfer device (not shown) at raised positions.

A shower head 11 is provided at a top plate 1a of the processing chamber 1. Gas diffusion spaces 11a and 11b are provided in the shower head 11. Gas injection holes 13a and 13b are formed on a lower surface of the shower head 11. The gas diffusion spaces 11a and 11b communicate with the gas injection holes 13a and 13b, respectively. A central portion of the shower head 11 is connected to gas supply pipes 15ab and 15c communicating with the gas diffusion spaces 11a and 11b respectively. The gas supply pipe 15ab is formed by joining two gas supply pipes 15a and 15b. Mass flow controllers (MFCs) 17a, 17b and 17c and valves 18a, 18b and 18c are provided in the gas supply pipes 15a, 15b and 15c, respectively. The gas supply pipe 15a that is one of branch pipes is connected to a gas supply source 19a, and the gas supply pipe 15b that is the other one of branch pipes is connected to the gas supply source 19b. Further, the gas supply pipe 15c is connected to the gas supply source 19c.

The gas supply source 19a supplies a gas of a compound containing silicon atoms (Si-containing compound gas) as a surface modification gas. The gas supply source 19b supplies, as a surface modification gas, an OH group-donating gas serving as a source of donating OH groups. Surface modification is carried out in order to form Si—OH groups at a surface of the insulating film provided on the wafer W.

As the Si-containing compound gas, for example, tetraethoxysilane (TEOS), tris(tert-butoxy)silanol, tetramethoxysilane, tetra-i-propoxysilane, tetra-n-propoxysilane, tetra-i-butoxysilane, tetra-n-butoxysilane, tetra-sec-butoxysilane, tetra-tert-butoxysilane, tris(tert-pentoxy)silanol, tris(isopropoxy)silanol, bis(tert-butoxy)silanediol, tetra(tert-butoxy)silane, monosilane, disilane, trisilane, tetrasilane, or the like may be used.

Among them, since silicon alkoxide which is represented by TEOS is hydrolyzed by reaction with water to generate Si—OH groups, it may be preferably used as Si-containing compounds in the present embodiment. Further, in order to promote the hydrolysis of Si-containing compounds, for example, a small amount of acid such as hydrochloric acid, nitric acid and sulfuric acid may be added. These acids may also be supplied in the state of an aqueous solution. Alternatively, these acids may be generated by reacting hydrogen chloride, nitrogen dioxide, sulfur trioxide or the like with water.

In addition, as the OH group-donating gas, for example, water vapor or alcohol may be used. Further, methanol, ethanol and the like can be specific examples of alcohol.

FIG. 1 illustrates a case where TEOS is used as the Si-containing compound gas supplied from the gas supply source 19a and water vapor ($H_2O$) is used as the OH group-donating gas supplied from the gas supply source 19b.

Further, each of tris(tert-butoxy)silanol, tris(tert-pentoxy)silanol, tris(isopropoxy)silanol, and bis(tert-butoxy)silanediol is a compound having an OH group and silicon atoms in the molecule, and may be vaporized to be used alone as "a gas of a compound having an OH group and silicon atoms."

A film forming gas including a manganese-containing material is supplied into the processing chamber 1 from the gas supply source 19c. Further, the gas supply source is not limited to that shown in the figure, and in addition to the film forming gas, for example, a cleaning gas for cleaning the inside of the processing chamber 1, a purge gas for replacing the atmosphere in the processing chamber 1 and the like may be supplied from the same mechanism. Further, instead of the OH group-donating gas, an oxidizing gas containing oxygen atoms may be supplied as the film forming gas. As the oxidizing gas, $O_2$, $O_3$, $NO_2$ or the like may be used.

Further, for example, a gasified precursor such as a metal complex, a manganese-containing organic metal compound or the like may be used as the gas including the manganese-containing material. As for the manganese-containing organic metal compound serving as the precursor, for example, $Mn(C_5H_5)_2$, $Mn(CH_3C_5H_4)_2$, $Mn(C_2H_5C_5H_4)_2$, $Mn(C_3H_7C_5H_4)_2$, $(CH_3C_5H_4)Mn(CO)_3$, $Mn(C_4H_9C_5H_4)_2$, $CH_3Mn(CO)_5$, $Mn(C_{11}H_{19}O_2)_3$, $Mn(C_7H_{11}C_2H_5C_5H_4)$, $Mn(C_5H_7O_2)_2$, $Mn(C_{11}H_{19}O_2)_2$, $Mn(C_5H_7O_2)_3$, $Mn(C_5HF_6O_2)_3$, $Mn((CH_3)_5C_5H_4)_2$ or the like may be used. These may be used singly or in combination of two or more. Among the precursors, $Mn(C_5H_5)_2$, $Mn(CH_3C_5H_4)_2$, $Mn(C_2H_5C_5H_4)_2$, $Mn(C_3H_7C_5H_4)_2$, $(CH_3C_5H_4)Mn(CO)_3$, $Mn(C_4H_9C_5H_4)_2$, $Mn((CH_3)_5C_5H_4)_2$ or the like, which is a cyclopentadienyl-based precursor, is particularly preferred.

In this embodiment, the Si-containing compound gas for surface modification is supplied from the gas supply source 19a to the gas diffusion space 11a in the shower head 11 through the gas supply pipes 15a and 15ab. The OH group-donating gas for surface modification is supplied from the gas supply source 19b to the gas diffusion space 11a in the shower head 11 through the gas supply pipes 15a and 15ab. The Si-containing compound gas and the OH group-donating gas are mixed in the gas supply pipe 15ab to be supplied to the shower head 11. The gas including the manganese-containing material, which is a raw material for film formation, is supplied from the gas supply source 19c to the gas diffusion space 11b in the shower head 11 through the gas supply pipe 15c.

The gases introduced into the gas diffusion space 11a and 11b are injected into a processing space in the processing chamber 1 through the gas injection holes 13a and 13b respectively, and the introduced gases are mixed together in the processing space. Further, depending on the type of gas, the gases may be mixed together in the middle of the gas supply pipe, or each gas may be introduced individually into the processing chamber 1.

The Si-containing compound, the OH group-donating gas, and the manganese-containing material, if necessary, may be gasified and supplied by bubbling them with a nonreactive gas such as $N_2$ or rare gas such as Ar, He and Ne whose flow rate is controlled. Instead of bubbling, a vaporizer may be provided to gasify the Si-containing compound, the OH group-donating gas, or the manganese-containing material. For example, it is possible to employ a method of vaporizing a liquid raw material at room temperature in the vaporizer, or a method of dissolving or mixing a liquid or a solid raw material in a solvent at room temperature to form a solution and vaporizing the solution in the vaporizer.

The solvent may be any solvent that can be dissolved without decomposing the Si-containing compound or the manganese-containing material. For example, hexane, hexadiene, pentane, heptane, cyclohexane, cyclooctane, toluene, mesitylene, xylene, diethyl ether, methyl isobutyl ether, tetrahydrofuran, methanol, ethanol, isopropanol, acetone, or the like may be selected depending on the type of film forming raw material. Further, if the vapor pressure of the Si-containing compound, the OH group-donating gas or the manganese-containing material is low, the raw material may be gasified and supplied by heating the gas supply sources 19a, 19b and 19c by using a heater (not shown) or the like. In addition, in order to prevent the gasified Si-containing compound, OH group-donating gas, or manganese-containing material from being liquefied again, a gas supply path including the gas supply pipes 15a, 15b, 15ab and 15c connected between the gas supply sources 19a, 19b and 19c and the shower head 11 may be heated by a heater (not shown).

An opening 25 is provided at a sidewall 1b of the processing chamber 1 to load/unload the wafer W to/from the processing chamber 1. Further, a gate valve 26 for opening and closing the opening 25 is provided.

An exhaust chamber 30 is connected to a bottom wall 1c of the processing chamber 1. The exhaust chamber 30 has a flange portion 30a, and is joined to the bottom wall 1c by the flange portion 30a. An exhaust port 31 is formed at a side portion of the exhaust chamber 30. An exhaust device 35 is connected to the exhaust port 31 via an exhaust pipe 33. The exhaust device 35 is equipped with, e.g., a pressure control valve, a vacuum pump or the like (not shown), and is configured to evacuate an inner space of the processing chamber 1 to a vacuum level.

An O-ring serving as a seal member is disposed at a junction of each member forming the processing chamber 1 in order to ensure the airtightness of the junction. For example, FIG. 1 representatively illustrates an annular O-ring 41 disposed at the junction between the top plate 1a and the sidewall 1b and an annular O-ring 45 disposed at the junction between the bottom wall 1c and the flange portion 30a of the exhaust chamber 30. An O-ring may also be disposed at another junction, but illustration and explanation will be omitted.

Figure 2:
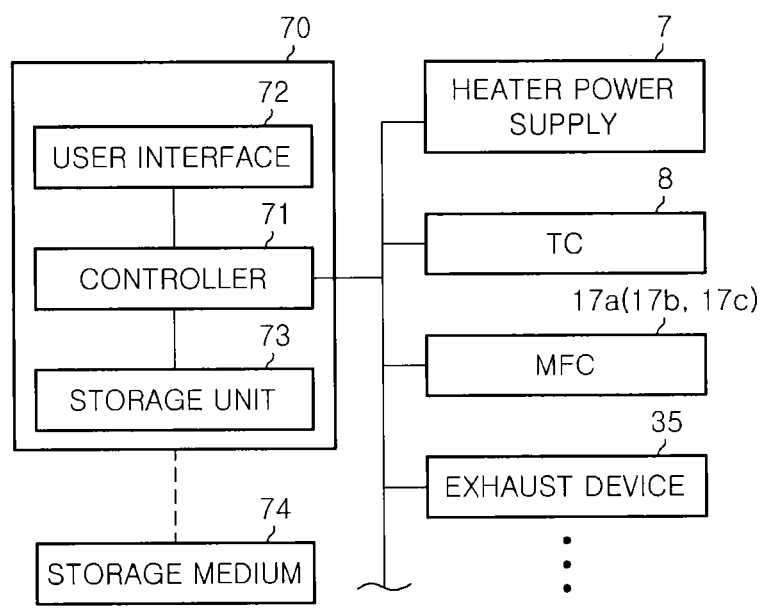
FIG. 2 is a block diagram showing a control system in the film forming apparatus shown in FIG. 1.

Each end device (e.g., the heater power supply 7, the thermocouple 8, the MFCs 17a, 17b and 17c, the exhaust device 35, and the like) included in the film forming apparatus 100 is connected to and controlled by a control unit 70. FIG. 2 illustrates a configuration example of a control system in the film forming apparatus 100. The control unit 70 includes a controller 71 that is a computer having a CPU, and a user interface 72 and a storage unit 73, which are connected to the controller 71. The user interface 72 includes a keyboard or a touch panel for allowing a process operator to perform an input operation of commands to manage the film forming apparatus 100, a display for visually displaying an operational status of the film forming apparatus 100, or the like.

The storage unit 73 stores a recipe including process condition data or control programs (software) for performing various processes in the film forming apparatus 100 under the control of the controller 71. Further, if necessary, a certain recipe or a control program is retrieved from the storage unit 73 in response to instructions inputted through the user interface 72 and is executed by the controller 71. Accordingly, a desired process is performed in the processing chamber 1 of the film forming apparatus 100 under the control of the controller 71.

Further, the recipe including the process condition data or the control programs may be used by installing those stored in a computer-readable storage medium 74 in the storage unit 73. The computer-readable storage medium 74 may be, but not particularly limited to, e.g., a CD-ROM, a hard disk, a flexible disk, a flash memory, a DVD or the like. Also, the recipe may be appropriately transmitted from another device via, e.g., a dedicated line to be available online.

In the film forming apparatus 100 configured as described above, a film forming process of a manganese-containing barrier film is performed by a CVD method under the control of the control unit 70.

As an example of the procedure of the film forming process, first, in a state where the gate valve 26 is opened, the wafer W is loaded into the processing chamber 1 through the opening 25 and transferred onto the lift pins (not shown) of the stage 3. Then, the lift pins are lowered so that the wafer W is mounted on the stage 3. Then, the gate valve 26 is closed, and the exhaust device 35 is operated to evacuate the processing chamber 1 to a vacuum level. Further, the wafer W is heated to a predetermined temperature by the heater 6. Then, the surface modification gas is supplied toward the wafer W through the gas injection holes 13a in the shower head 11. Then, the film forming gas is supplied toward the wafer W through the gas injection holes 13b in the shower head 11. In this way, the manganese-containing barrier film can be formed on the surface of the wafer W.

Further, the surface modification gas and the film forming gas may be supplied at the same time, or may be supplied alternately. Gas supply timing will be described in detail later.

Preferable conditions in the surface modification process are described as follows.

A flow rate of the Si-containing compound gas may be appropriately changed depending on the size of the wafer W or the processing chamber 1. Accordingly, it is preferable that the flow rate of the Si-containing compound gas is, but not particularly limited to, e.g., in a range from 0.1 sccm (mL/min) to 1000 sccm (mL/min).

Further, a flow rate of the OH group-donating gas may be appropriately changed depending on the size of the wafer W or the processing chamber 1. Accordingly, it is preferable that the flow rate of the OH group-donating gas is, but not particularly limited to, e.g., in a range from 0.1 sccm (mL/min) to 1000 sccm (mL/min).

Further, a process pressure is, in view of the ease of pressure control, preferably in a range from 1 Pa to 10000 Pa, and more preferably, in a range from 10 Pa to 1000 Pa.

Further, the heating temperature of the wafer W, i.e., the temperature of the stage 3, is preferably, e.g., in a range from 0° C. to 500° C., and more preferably, in a range from 20° C. to 400° C.

Next, preferable conditions in the film forming process are described as follows.

A flow rate of the gas including the manganese-containing material may be appropriately changed depending on the size of the wafer W or the processing chamber 1. Accordingly, it is preferable that the flow rate of the gas including the manganese-containing material is, but not particularly limited to, e.g., in a range from 0.1 sccm (mL/min) to 1000 sccm (mL/min).

Further, a process pressure is, in view of the ease of pressure control, preferably in a range from 1 Pa to 10000 Pa, and more preferably, in a range from 10 Pa to 1000 Pa.

Further, the heating temperature of the wafer W, i.e., the temperature of the stage 3, is preferably, e.g., in a range from 0° C. to 500° C., and more preferably, in a range from 20° C. to 400° C.

The above conditions are stored as a recipe in the storage unit 73 of the control unit 70. Then, the controller 71 reads out the recipe and transmits a control signal to each end device of the film forming apparatus 100 so that the film forming process is carried out under desired conditions.

Then, the film forming method will be described in detail by illustrating first to third embodiments.

First Embodiment

Figure 3:
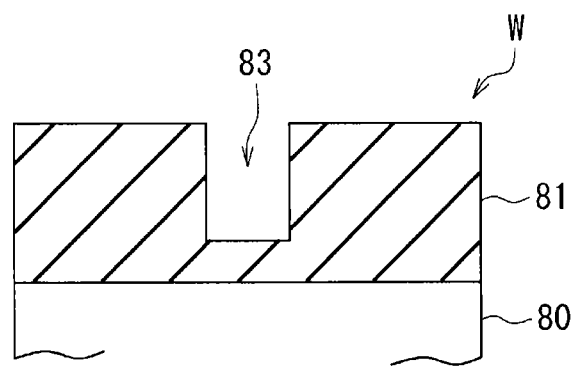
FIG. 3 is a cross-sectional view showing a main part of a surface of a wafer on which an insulating film having a pattern is formed in a film forming method in accordance with a first embodiment of the present invention.
Figure 4:
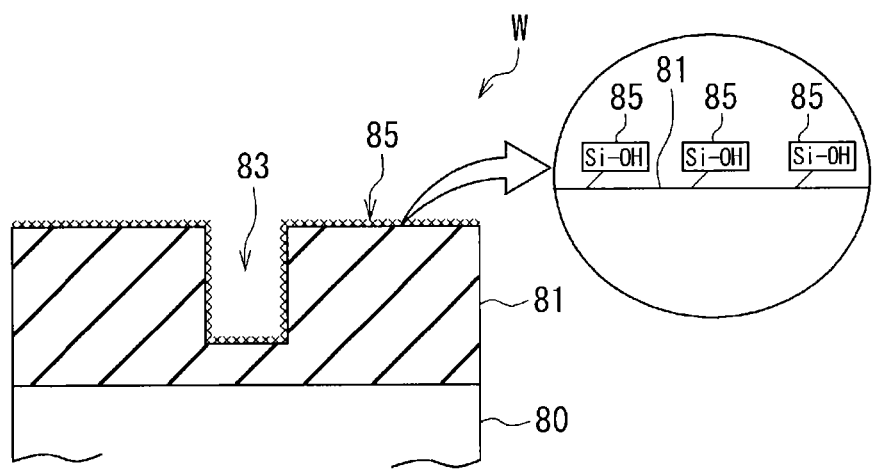
FIG. 4 is a cross-sectional view of the main part of the surface of the wafer showing a state after a surface modification in a subsequent step after the step shown in FIG. 3.
Figure 5:
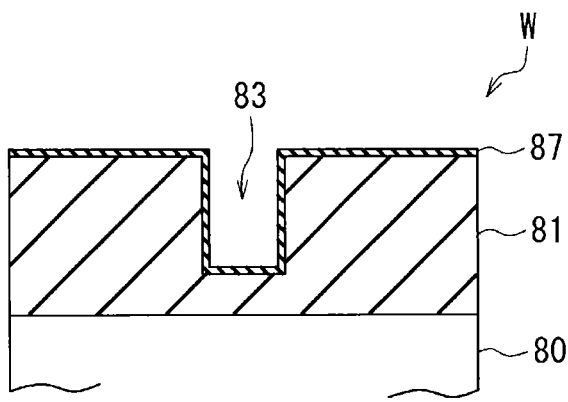
FIG. 5 is a cross-sectional view of the main part of the surface of the wafer showing a state where a manganese-containing film is formed in a subsequent step after the step shown in FIG. 4.

A film forming method in accordance with a first embodiment of the present invention is carried out, e.g., by performing a step of arranging an object to be processed on which an insulating film is formed in the processing chamber of the film forming apparatus, a surface modification step of supplying the Si-containing compound gas and the OH group-donating gas into the processing chamber so that Si—OH groups are formed on a surface of the insulating film, and a film forming step of supplying the film forming gas including the manganese-containing material into the processing chamber so that a manganese-containing film is formed on the surface of the insulating film on which the Si—OH groups have been formed by a CVD method. FIGS. 3 to 5 show main steps of the film forming method in accordance with the first embodiment.

<Step of Arranging Object to be Processed in Processing Chamber>

In this step, as an object to be processed, the wafer W on which the insulating film is formed is arranged in the processing chamber 1 of the film forming apparatus 100. Specifically, the wafer W is loaded into the processing chamber 1 through the opening 25 of the film forming apparatus 100, and transferred onto the lift pins (not shown) of the stage 3. Then, the lift pins are lowered so that the wafer W is mounted on the stage 3.

Here, as shown in FIG. 3, a base film 80 and an insulating film 81 which is stacked on the base film 80 are formed on the wafer W. A predetermined irregularity pattern is formed in the insulating film 81 and the insulating film 81 has an opening (which indicates a through-hole or recess such as a trench) 83. Further, only one opening 83 is illustrated, but the insulating film 81 may have multiple openings. The opening 83 is a part to be used as, e.g., a via hole or a wiring groove of a multilayer wiring structure. For example, a low dielectric constant (low-k) film such as SiCOH, SiOF, CFy (y being a positive number), BSG, HSQ, porous silica, SiOC, MSQ, porous MSQ and porous SiCOH can be an example of the insulating film 81. Further, in the present specification, "low dielectric constant" means that a relative dielectric constant is, e.g., equal to or less than 3.8, preferably, equal to or less than 3.0.

<Surface Modification Step>

In the surface modification step, the Si-containing compound gas and the OH group-donating gas are supplied into the processing chamber 1 and brought into contact with the surface of the insulating film 81. By doing so, Si—OH groups 85 are formed on the surface of the insulating film 81 as shown in FIG. 4. Specifically, the Si-containing compound gas and the OH group-donating gas are dissociated in the processing chamber 1 to react with a low-k material of the insulating film 81, thereby forming the multiple Si—OH groups 85 on the surface of the insulating film 81. For example, in the combination of using TEOS as the Si-containing compound gas and using water vapor as the OH group-donating gas, TEOS is hydrolyzed by the water vapor, and the generated Si—OH groups 85 are introduced into the surface of the insulating film 81. By this introduction of the Si—OH groups 85, the surface of the insulating film 81 is modified to be hydrophilic. As a result, it increases an adhesion of the manganese-containing film in the subsequent film forming step and improves deposition efficiency in a CVD method, thereby forming the manganese-containing film sufficiently thick enough to function as a barrier.

As will be described later, the Si-containing compound gas and the OH group-donating gas may be separately introduced at respective different timings into the processing chamber 1 of the film forming apparatus 100, or may be simultaneously introduced into the processing chamber 1. Further, the Si-containing compound gas and the OH group-donating gas may be introduced as a gas mixture into the processing chamber 1. Further, the Si-containing compound gas and the OH group-donating gas may be alternately introduced into the processing chamber 1.

<Film Forming Step>

In the film forming step, as shown in FIG. 5, a manganese-containing film 87 is formed on the surface of the insulating film 81 on which the Si—OH groups 85 have been formed by a CVD method. The manganese-containing film 87 may be formed by using the manganese-containing material as a precursor. The manganese-containing film 87 functions as a barrier film to suppress the diffusion of Cu into the insulating film 81 after Cu wiring or Cu plug has been filled in the opening 83. Mn contained in the manganese-containing film 87 exists primarily in a state of oxide $MnO_x$ (x indicating a stoichiometric number). $MnO_x$ includes, e.g., MnO, $Mn_3O_4$, $Mn_2O_3$, $MnO_2$ and the like depending on the valency of Mn. The thickness of the manganese-containing film 87 is preferably in a range from, e.g., 0.5 to 10 nm, and more preferably in a range from 1 to 2 nm in view of maintaining barrier properties and suppressing an increase in RC product.

In the film forming method of this embodiment, there are several variations depending on the timing of the introduction of the Si-containing compound gas and the OH group-donating gas. The typical procedure will be described with reference to FIGS. 6 and 7. Further, a case of using TEOS as the Si-containing compound gas and using water vapor as the OH group-donating gas will be described as a typical example.

Figure 6:
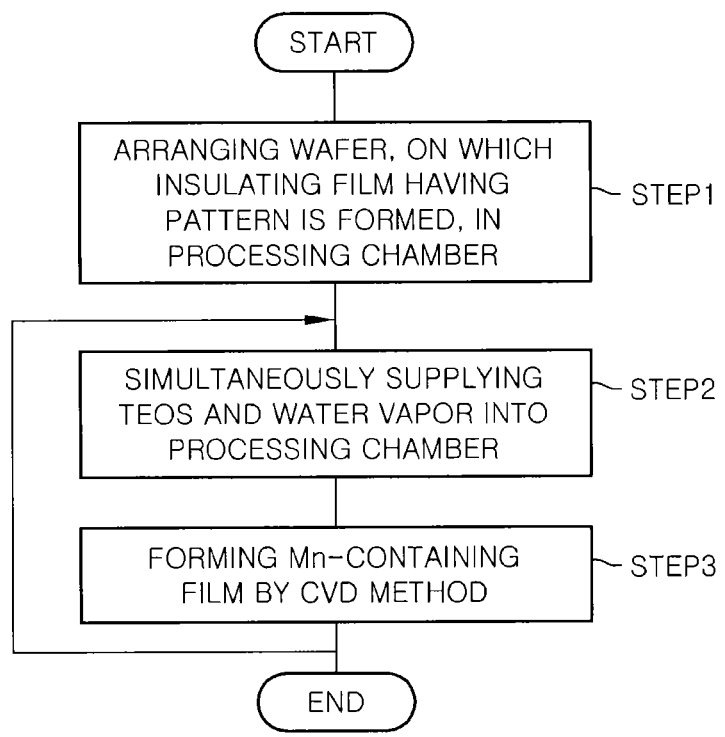
FIG. 6 is a flowchart showing an example of a procedure of the film forming method in accordance with the first embodiment of the present invention.

FIG. 6 is a flowchart showing an example of a procedure of simultaneously supplying the TEOS and the water vapor into the processing chamber 1. STEP1 is a step of arranging the wafer W which is an object to be processed in the processing chamber 1 as described above.

STEP2 is a surface modification step to simultaneously supply the TEOS and the water vapor into the processing chamber 1. Specifically, the TEOS is supplied into the processing chamber 1 from the gas supply source 19*a* of the film forming apparatus 100 through the gas supply pipes 15*a* and 15*ab* and the gas diffusion space 11*a* provided in the shower head 11. Further, the water vapor is introduced into the processing chamber 1 from the gas supply source 19*b* through the gas supply pipes 15*b* and 15*ab* and the gas diffusion space 11*a* provided in the shower head 11. In FIG. 1, the TEOS and the water vapor are mixed in the gas supply pipe 15*ab* and supplied in the mixed state, but may be supplied into the processing chamber 1 through separate pipes respectively. By processing of STEP2, the Si—OH groups 85 are formed on the surface of the insulating film 81.

STEP3 is a film forming step to form the manganese-containing film 87 on the surface of the insulating film 81 on which the Si—OH groups 85 have been formed by a CVD method. Specifically, the gas including the manganese-containing material serving as a film forming raw material is introduced into the processing chamber 1 from the gas supply source 19*c* through the gas supply pipe 15*c* and the gas diffusion space 11*b* provided in the shower head 11. Then, a thin film of the manganese-containing film 87 is formed by the CVD method to cover the surface of the insulating film 81. Since the Si—OH groups 85 are formed on the surface of the insulating film 81 by the surface modification, the manganese-containing film 87 is easily adhered, and the manganese-containing film 87 may also be formed to have a uniform thickness in the opening 83.

STEP2 and STEP3 may be carried out alternately and repeatedly. Specifically, instead of forming the manganese-containing film 87 by performing the CVD method only once, the film forming process may be carried out multiple times, and the surface modification step of STEP2 may be carried out therebetween. Thus, by alternately repeating the surface modification step (STEP2) and the film forming step (STEP3), a sufficient number of the Si—OH groups 85 are formed on the surface of the insulating film 81 to facilitate the adhesion of the manganese-containing film 87 and the manganese-containing film 87 can be formed to have a desired film thickness.

Figure 7:
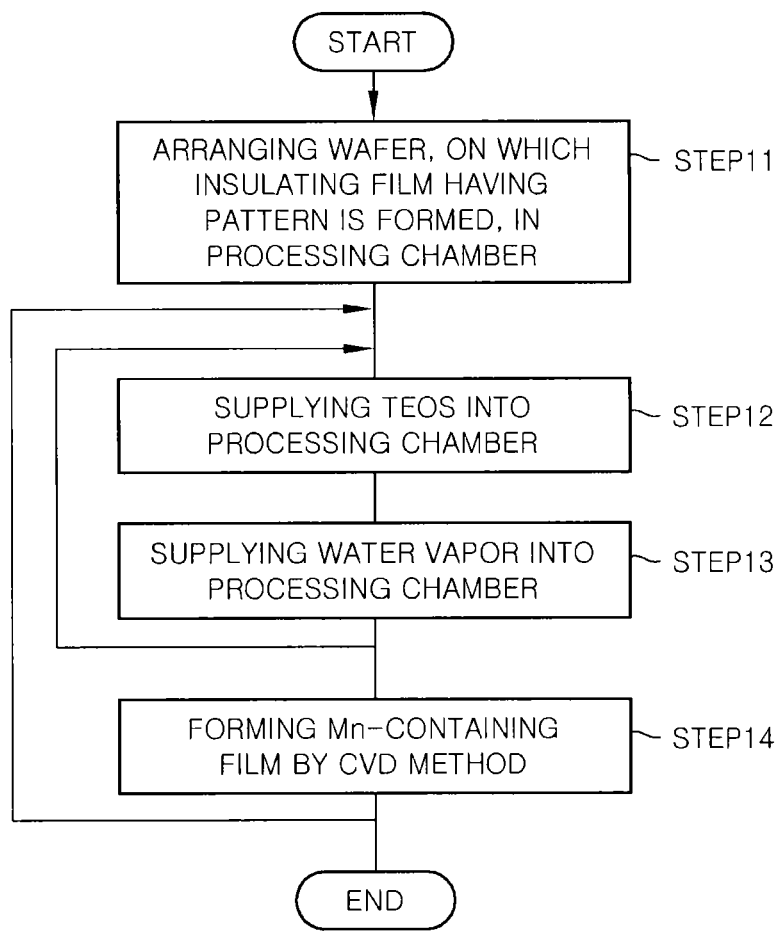
FIG. 7 is a flowchart showing another example of a procedure of the film forming method in accordance with the first embodiment of the present invention.

FIG. 7 is a flowchart showing an example of a procedure of separately supplying the TEOS and the water vapor into the processing chamber 1.

STEP11 shown in FIG. 7 can be carried out in the same manner as STEP1 shown in FIG. 6, and thus a description thereof will be omitted.

STEP12 is a part of the surface modification step, wherein the TEOS is first supplied into the processing chamber 1. Specifically, the TEOS is supplied into the processing chamber 1 from the gas supply source 19*a* through the gas supply pipes 15*a* and 15*ab* and the gas diffusion space 11*a* provided in the shower head 11.

STEP13 is also a part of the surface modification step, wherein the water vapor is supplied into the processing chamber 1. Specifically, the water vapor is introduced into the processing chamber 1 from the gas supply source 19*b* through the gas supply pipes 15*b* and 15*ab* and the gas diffusion space 11*a* provided in the shower head 11. By processing of STEP12 and STEP13, the Si—OH groups 85 are formed on the surface of the insulating film 81.

STEP12 and STEP13 may be performed in the reverse order. That is, the water vapor may be first introduced into the processing chamber 1 and the TEOS may be subsequently introduced into the processing chamber 1. Further, in the film forming apparatus 100 shown in FIG. 1, the switching of gas in STEP12 and STEP13 is carried out by opening and closing the valves 18*a* and 18*b*, but the TEOS and the water vapor may be supplied into the processing chamber 1 through separate pipes respectively.

STEP14 is a film forming step and may be carried out in the same manner as STEP3 shown in FIG. 6. Further, STEP12/STEP13 and STEP14 may be carried out alternately and repeatedly. Specifically, instead of forming the manganese-containing film 87 by performing the CVD method only once, the film forming process may be carried out multiple times, and the surface modification step of STEP12/STEP13 may be carried out therebetween. Thus, by alternately repeating the surface modification step (STEP12/STEP13) and the film forming step (STEP14), a sufficient number of the Si—OH groups 85 are formed on the surface of the insulating film 81 to facilitate the adhesion of the manganese-containing film 87 and the manganese-containing film 87 can be formed to have a desired film thickness.

As described above, in the film forming method of this embodiment, by performing the surface modification step before forming the manganese-containing film 87, the adhesion of the manganese-containing film 87 can be improved and the manganese-containing film 87, which has a sufficient film thickness to function as a barrier, can be formed uniformly on the surface of the insulating film 81. Further, by performing the surface modification step, it is also possible to solve a problem of step coverage that was a major issue in the formation of a conventional barrier film. Specifically, for example, even if the opening 83 formed in the insulating film 81 serving as an interlayer insulating film has a high aspect ratio, wherein its aperture diameter is narrow with respect to its depth, the manganese-containing film 87 can be formed to have a uniform film thickness in the opening 83 by performing the surface modification step.

Further, since the manganese-containing film 87 formed by the film forming method of this embodiment has excellent barrier properties, Cu is suppressed from being diffused into the insulating film 81 from a copper wiring. Therefore, by forming the manganese-containing film 87 to have a sufficient thickness, it is possible to prevent the Cu diffusion into the insulating film 81 and ensure the reliability of the interlayer insulating film.

Second Embodiment

A film forming method in accordance with a second embodiment of the present invention is carried out, e.g., by performing a step of arranging an object to be processed having an insulating film in the processing chamber of the film forming apparatus, and a film forming step of simultaneously supplying the Si-containing compound gas, the OH group-donating gas and the film forming gas including the manganese-containing material into the processing chamber so that a manganese-containing film is formed on the surface of the insulating film by a CVD method. That is, the second embodiment is a modification example in which the surface modification step and the film forming step of the first embodiment are performed simultaneously without distinction. Thus, the following description will be made focusing on differences from the film forming method of the first embodiment, and a redundant description thereof will be omitted. Further, the description will also be made by appropriately referring to FIGS. 3 to 5.

Figure 8:
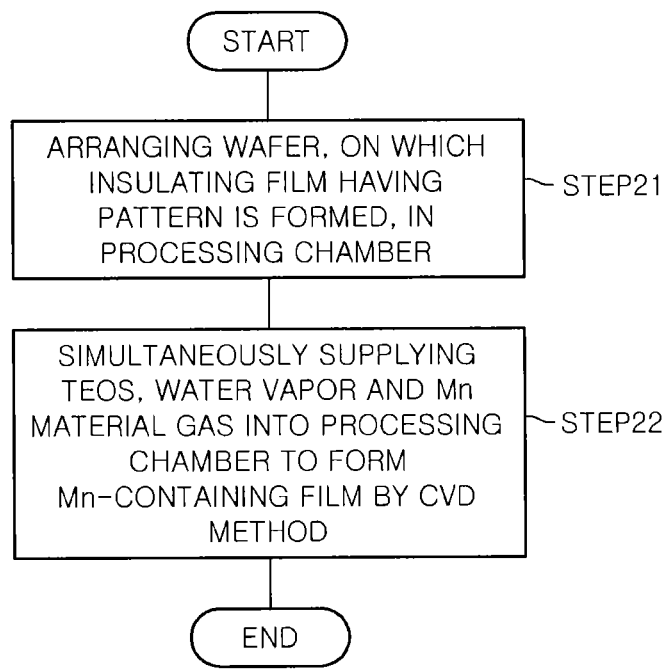
FIG. 8 is a flowchart showing an example of a procedure of a film forming method in accordance with a second embodiment of the present invention.

FIG. 8 is a flowchart showing an example of a procedure of the film forming method in accordance with the second embodiment. Here, a case of using TEOS as the Si-containing compound gas and using water vapor as the OH group-donating gas will be described as an example.

STEP21 shown in FIG. 8 can be carried out in the same manner as STEP1 and STEP11 respectively shown in FIGS. 6 and 7, and thus a description thereof will be omitted.

In STEP22, the TEOS, the water vapor and the film forming gas including the manganese-containing material are supplied simultaneously into the processing chamber 1. In other words, in this embodiment, the surface modification and the film forming process of the insulating film 81 are performed simultaneously.

Specifically, from FIG. 1, the TEOS is supplied into the processing chamber 1 from the gas supply source 19a through the gas supply pipes 15a and 15ab and the gas diffusion space 11a provided in the shower head 11. At the same time, the water vapor is introduced into the processing chamber 1 from the gas supply source 19b through the gas supply pipes 15b and 15ab and the gas diffusion space 11a provided in the shower head 11. Further, the gas including the manganese-containing material which is a film forming raw material is introduced into the processing chamber 1 from the gas supply source 19c through the gas supply pipe 15c and the gas diffusion space 11b provided in the shower head 11.

In FIG. 1, the TEOS and the water vapor are mixed in the gas supply pipe 15ab and supplied in a mixed state, but it may be configured to be supplied into the processing chamber 1 through separate pipes respectively. Alternatively, it may be configured to mix the TEOS, the water vapor and the gas including the manganese-containing material in the middle of the pipe. Further, while the formation of the manganese-containing film 87 is performed by a CVD method in the processing chamber 1 by supplying the gas including the manganese-containing material, the TEOS from the gas supply source 19a and the water vapor from the gas supply source 19b may be introduced into the processing chamber 1 intermittently (non-continuously) by opening and closing the valves 18a and 18b.

Then, a thin film of the manganese-containing film 87 is formed by the CVD method to cover the surface of the insulating film 81. In this case, since the TEOS and the water vapor coexist in the processing chamber 1, the TEOS is hydrolyzed, and the surface of the insulating film 81 is modified to generate the Si—OH groups 85. Accordingly, it enhances adsorption of the manganese-containing material serving as a precursor and the manganese-containing film 87 becomes easily adhered.

Other configurations and effects in the film forming method of this embodiment are similar to those of the first embodiment.

Third Embodiment

Figure 9:
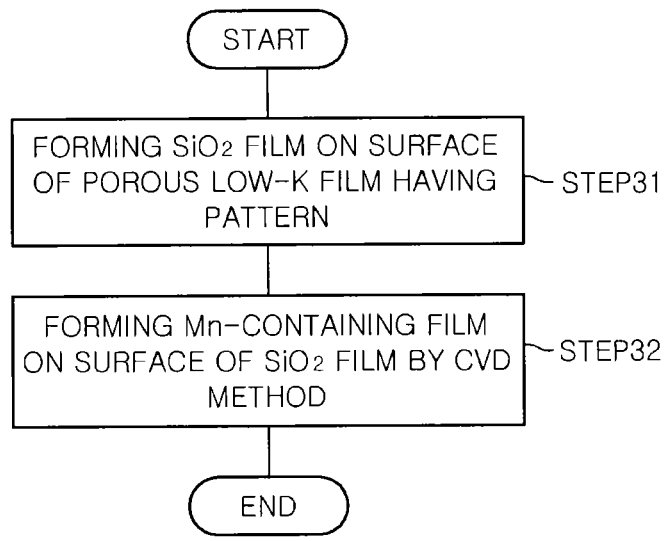
FIG. 9 is a flowchart showing an example of a procedure of a film forming method in accordance with a third embodiment of the present invention.
Figure 10:
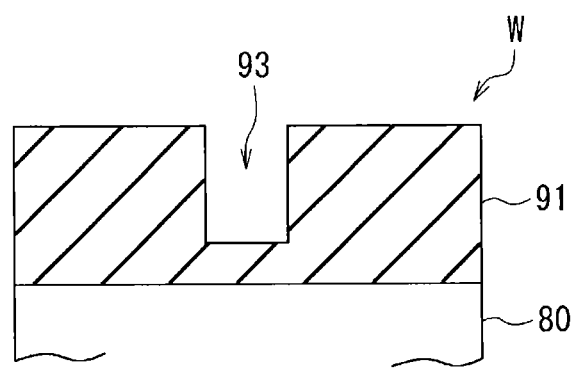
FIG. 10 is a cross-sectional view showing a main part of a surface of a wafer on which an insulating film having a pattern is formed in the film forming method in accordance with the third embodiment of the present invention.
Figure 11:
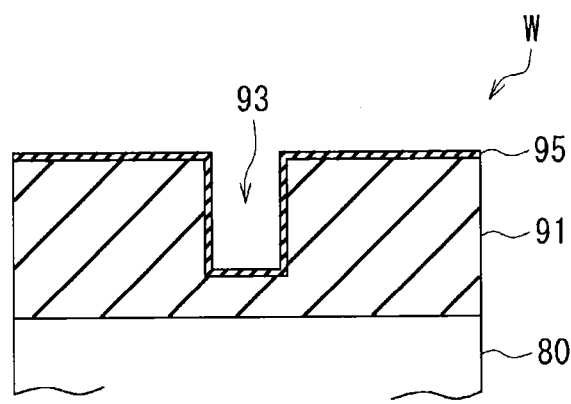
FIG. 11 is a cross-sectional view of the main part of the surface of the wafer showing a state where a $SiO_2$ film is formed in a subsequent step after the step shown in FIG. 10.
Figure 12:
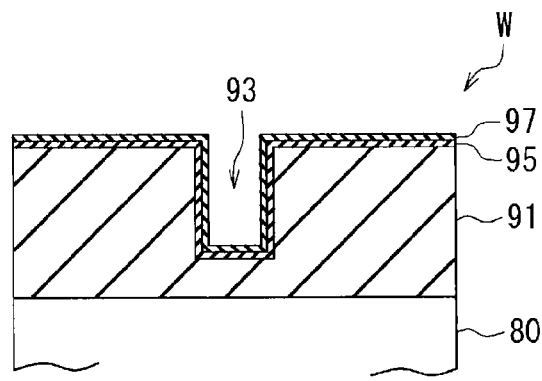
FIG. 12 is a cross-sectional view of the main part of the surface of the wafer showing a state where a manganese-containing film is formed in a subsequent step after the step shown in FIG. 11.
Figure 13:
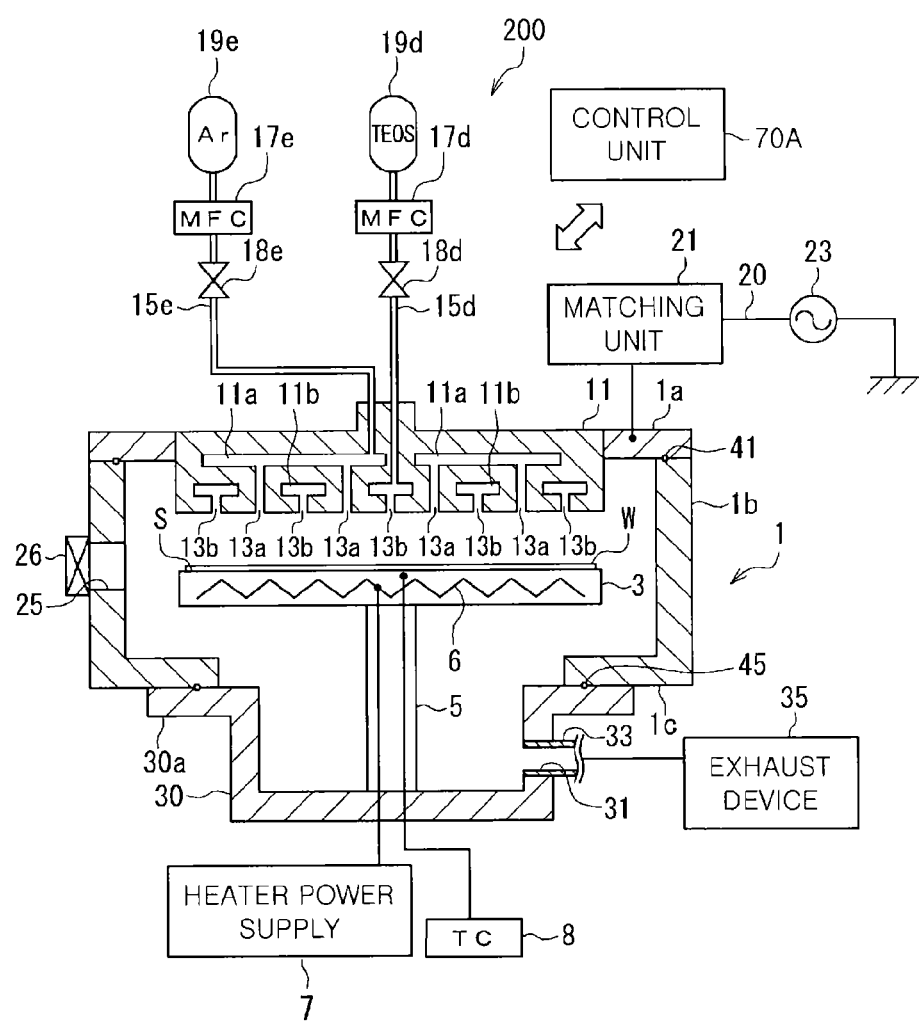
FIG. 13 is a cross-sectional view showing a schematic configuration of a film forming apparatus that can be used in the film forming method in accordance with the third embodiment of the present invention.

Next, a third embodiment of the present invention will be described with reference to FIGS. 9 to 17. A film forming method in accordance with the third embodiment of the present invention includes a first film forming step of forming a silicon dioxide film ($SiO_2$ film) on a surface of the low-k film having a predetermined irregularity pattern formed on an object to be processed, and a second film forming step of forming a manganese-containing film on a surface of the silicon dioxide film by a CVD method by using the film forming gas including the manganese-containing material. FIG. 9 is a flowchart showing main steps of the film forming method of this embodiment. FIGS. 10 to 12 are views for explaining the steps. The following description will be made by using a porous low-k film as an example of the low-k film.

FIG. 10 shows a cross-sectional structure of a surface portion of the wafer W serving as an object to be processed. The base film 80 and a porous low-k film 91 which is stacked on the base film 80 are formed on the wafer W. A predetermined irregularity pattern is formed in the porous low-k film 91 which has an opening 93 (only one opening being shown, but multiple openings possibly being formed). The opening 93 is a part to be used as, e.g., a via hole or a wiring groove of a multilayer wiring structure. For example, porous silica, porous MSQ or porous SiCOH can be an example of the porous low-l film 91.

<First Film Forming Step>

In STEP31, as shown in FIG. 11, a $SiO_2$ film 95 is formed on the surface of the porous low-k film 91 by a plasma CVD method by using the film forming gas including the Si-containing compound gas. In the first film forming step, a plasma film forming apparatus is used. As an example of the plasma film forming apparatus, a plasma film forming apparatus 200 shown in FIG. 13 may be used. The plasma film forming apparatus 200 is a parallel plate type plasma CVD apparatus, and has substantially the same configuration as that of the film forming apparatus 100 shown in FIG. 1 except that a plasma of the film forming gas is generated in the processing chamber 1 by supplying a high frequency power to the shower head 11. Therefore, the description will be made focusing on differences from the film forming apparatus 100. Further, like reference numerals will be given to like parts as those in the film forming apparatus 100 and a redundant description thereof will be omitted.

In the plasma film forming apparatus 200, a high frequency power supply 23 is connected to the shower head 11 via a power feed line 20 and a matching unit 21. The high frequency power supply 23 supplies a high frequency power having a frequency, e.g., in a range from 400 kHz to 100 MHz, preferably, in a range from 2 MHz to 60 MHz. By supplying a high frequency power to the shower head 11 from the high frequency power supply 23, the film forming process can be performed by using a plasma of a source gas supplied into the processing chamber 1 through the shower head 11. The power feed line 20, the matching unit 21 and the high frequency power supply 23 in this embodiment are included in an "electromagnetic wave feeding device." Further, the electromagnetic wave feeding device having a similar configuration may be provided on the stage 3 oppositely facing the shower head 11 to supply a high frequency power.

Further, the plasma film forming apparatus 200 includes gas supply sources 19*d* and 19*e*. The Si-containing compound gas is supplied into the gas diffusion space 11*b* in the shower head 11 from the gas supply source 19*d* through a gas supply pipe 15*d*. In this case, the description will be made by using TEOS as an example of the Si-containing compound. A rare gas for plasma excitation (in this case, Ar gas being representatively used) is supplied from the gas supply source 19*e* into the gas diffusion space 11*a* in the shower head 11 through a gas supply pipe 15*e*. The gas supply pipes 15*d* and 15*e* are provided with mass flow controllers (MFCs) 17*d* and 17*e* and valves 18*d* and 18*e*, respectively. The gases introduced into the gas diffusion spaces 11*a* and 11*b* are injected into a processing space in the processing chamber 1 through the gas injection holes 13*a* and 13*b* respectively, and the introduced gases are mixed together in the processing space. Further, the TEOS and the Ar gas may be mixed in the middle of the gas supply pipe to be supplied into the shower head 11. Further, a control unit 70A has substantially the same configuration as that of the control unit 70.

Next, preferable conditions in the film forming process of the SiO$_2$ film 95 are described as follows. A flow rate of the Si-containing compound gas such as the TEOS may be appropriately changed depending on the size of the wafer W or the processing chamber 1. Accordingly, it is preferable that the flow rate of the Si-containing compound gas is, but not particularly limited to, e.g., in a range from 1 sccm (mL/min) to 1000 sccm (mL/min).

Further, a flow rate of the rare gas such as Ar may be appropriately changed depending on the size of the wafer W or the processing chamber 1. Accordingly, it is preferable that the flow rate of the rare gas is, but not particularly limited to, e.g., in a range from 1 sccm (mL/min) to 1000 sccm (mL/min).

Further, a process pressure is, in view of the ease of pressure control and the stability of plasma discharge, preferably in a range from 0.1 Pa to 1000 Pa, and, more preferably, in a range from 1 Pa to 100 Pa.

Further, a high frequency power, e.g., in a range from 10 to 5000 W, preferably, in a range from 100 to 3000 W is supplied from the high frequency power supply 23 at a frequency, e.g., in a range from 400 kHz to 100 MHz, preferably, in a range from 2 MHz to 60 MHz.

Further, the heating temperature of the wafer W, i.e., the temperature of the stage 3, is preferably, e.g., in a range from 50° C. to 500° C., and more preferably, in a range from 100° C. to 400° C.

The above conditions are stored as a recipe in a storage unit (not shown) of the control unit 70A. Then, the controller reads out the recipe and transmits a control signal to each end device of the plasma film forming apparatus 200 so that the film forming process is carried out under desired conditions.

In the manner as described above, the SiO$_2$ film 95 may be formed uniformly on the porous low-k film 91. The thickness of the SiO$_2$ film 95 is preferably, e.g., in a range from 0.1 to 10 nm, and more preferably, in a range from 0.5 to 5 nm in view of the improvement of adhesion of the manganese-containing film and the suppression of an increase in an effective dielectric constant.

<Second Film Forming Step>

In STEP32, the film forming process is performed by a CVD method by using the film forming gas including the manganese-containing material. By performing the second film forming step, as shown in FIG. 12, a manganese-containing film 97 is formed uniformly on the SiO$_2$ film 95. In the second film forming step, the film forming process may be performed under the same conditions as the first embodiment by using the film forming apparatus 100 similar to that shown in FIG. 1.

By interposing the SiO$_2$ film 95 between the porous low-k film 91 and the manganese-containing film 97, even if the manganese-containing film 97 is formed, it is possible to prevent Mn from entering into pores of the porous low-k film 91 to thereby effectively suppress the diffusion of Cu into the porous low-k film 91. Further, the SiO$_2$ film 95 formed by using TEOS as a raw material has hydrophilic Si—OH groups on the surface of the film. Since the manganese-containing material serving as a precursor of MnO$_x$ forming the manganese-containing film 97 has an affinity with Si—OH groups, the adhesion of the manganese-containing film 97 in the second film forming step (STEP32) can be improved, and the manganese-containing film 97 having a sufficient film thickness to function as a barrier can be formed uniformly on the surface of the SiO$_2$ film 95. In addition, the manganese-containing film 97 can be also formed in the opening 93 to have a uniform film thickness with good step coverage.

Next, modification examples of the film forming method in accordance with the third embodiment will be described with reference to FIGS. 14 to 17.

<First Modification Example>

FIG. 14 is a flowchart showing a procedure of a first modification example. First, in STEP41, the SiO$_2$ film 95 is formed on the surface of the porous low-k film 91 having an irregularity pattern by a plasma CVD method by using the film forming gas including the Si-containing compound gas. This step is the first film forming step similar to STEP31 shown in FIG. 9.

Then, in STEP42, the SiO$_2$ film 95 is exposed to the atmosphere. Specifically, the SiO$_2$ film 95 is exposed to the atmosphere to absorb moisture between the first film forming step (STEP41) and the second film forming step (STEP43). By allowing the SiO$_2$ film 95 to absorb moisture, Si—OH groups are formed on the surface of the SiO$_2$ film 95. In other words, it is possible to further increase the amount of Si—OH groups on the surface of the SiO$_2$ film 95. Therefore, by the same mechanism as in the first embodiment, the adhesion of the manganese-containing film 97 in the subsequent second film forming step (STEP43) can be further improved.

Then, in STEP43, the film forming process is performed by a CVD method by using the film forming gas including the manganese-containing material. This step is the second film forming step similar to STEP32 shown in FIG. 9.

<Second Modification Example>

FIG. 15 is a flowchart showing a procedure of a second modification example. First, in STEP51, the SiO$_2$ film 95 is formed on the surface of the porous low-k film 91 having an irregularity pattern by a plasma CVD method by using the film forming gas including the Si-containing compound gas. This step is the first film forming step similar to STEP31 shown in FIG. 9.

Then, in STEP52, the SiO$_2$ film 95 is brought into contact with water vapor. Specifically, the SiO$_2$ film 95 absorbs moisture to form Si—OH groups on the surface of the SiO$_2$ film 95 between the first film forming step (STEP51) and the second film forming step (STEP53). Therefore, by the same mechanism as in the first embodiment, the adhesion of the manganese-containing film 97 in the subsequent second film forming step (STEP53) can be further improved.

Then, in STEP53, the film forming process is performed by a CVD method by using the film forming gas including the manganese-containing material. This step is the second film forming step similar to STEP32 shown in FIG. 9.

As described above, by adding the step of exposing the SiO$_2$ film 95 to the atmosphere or bringing the SiO$_2$ film 95 into contact with the water vapor between the first film forming step and the second film forming step, it is possible to increase the amount of the Si—OH groups on the surface of the SiO$_2$ film 95 and further improve the adhesion of the manganese-containing film 97.

<Third Modification Example>

Next, a third modification example will be described with reference to FIGS. 16A, 16B and 17. The third modification example is applicable to a first film forming step in another aspect of the third embodiment. In the first film forming step of this modification example, the SiO$_2$ film 95 is formed on the surface of the porous low-k film 91 by a molecular layer deposition (MLD) method by using an aminosilane-based precursor. In other words, this modification example may be carried out in the same manner as other aspects of the third embodiment except for that the SiO$_2$ film 95 is formed by the MLD method instead of the plasma CVD method in STEP31, STEP 41 and STEP 51 respectively shown in FIG. 9, FIG. 14 and FIG. 15.

Figure 16A:
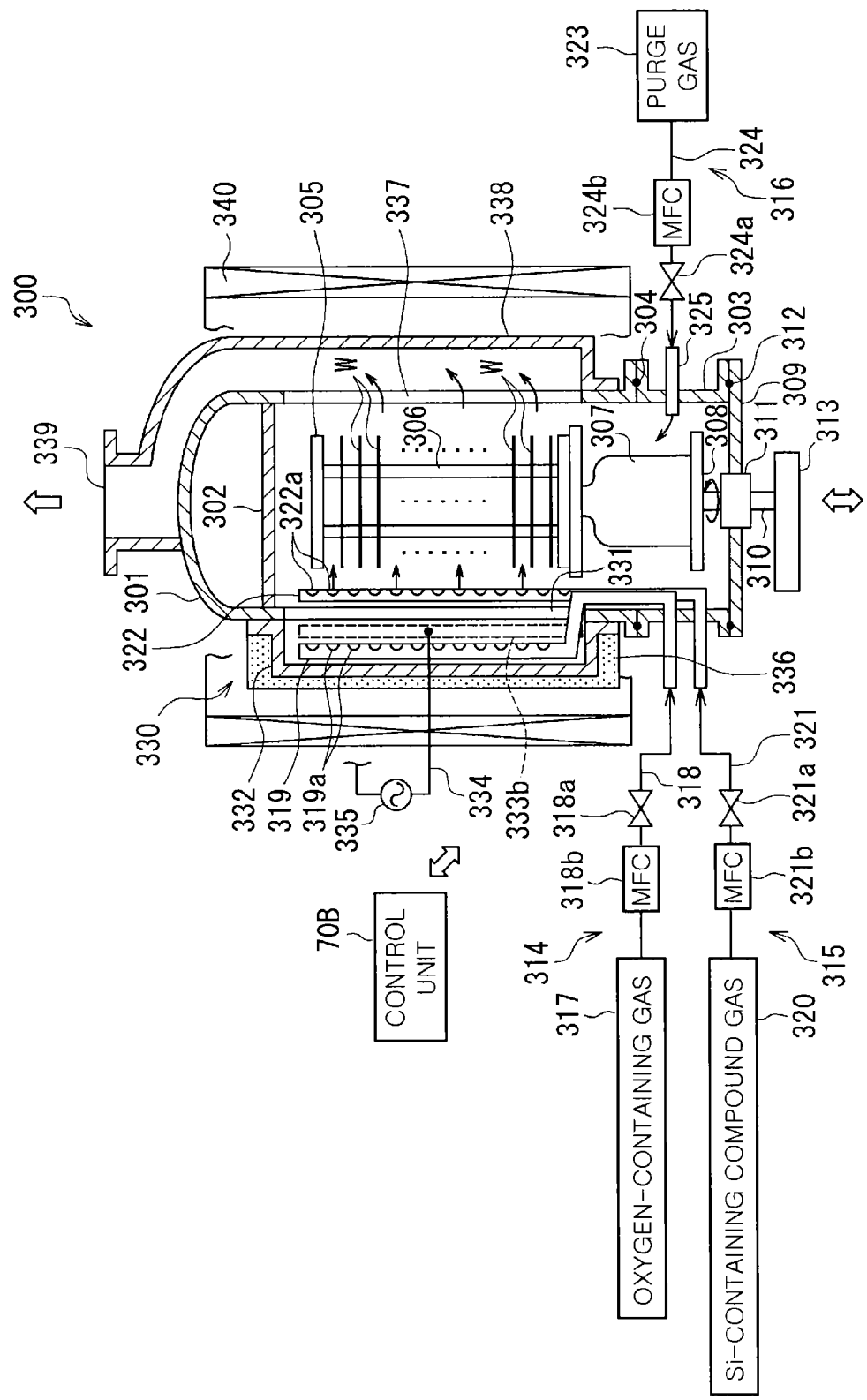
FIG. 16A is a vertical cross-sectional view schematically showing a configuration of a film forming apparatus that can be used in a third modification example of the film forming method in accordance with the third embodiment of the present invention.
Figure 16B:
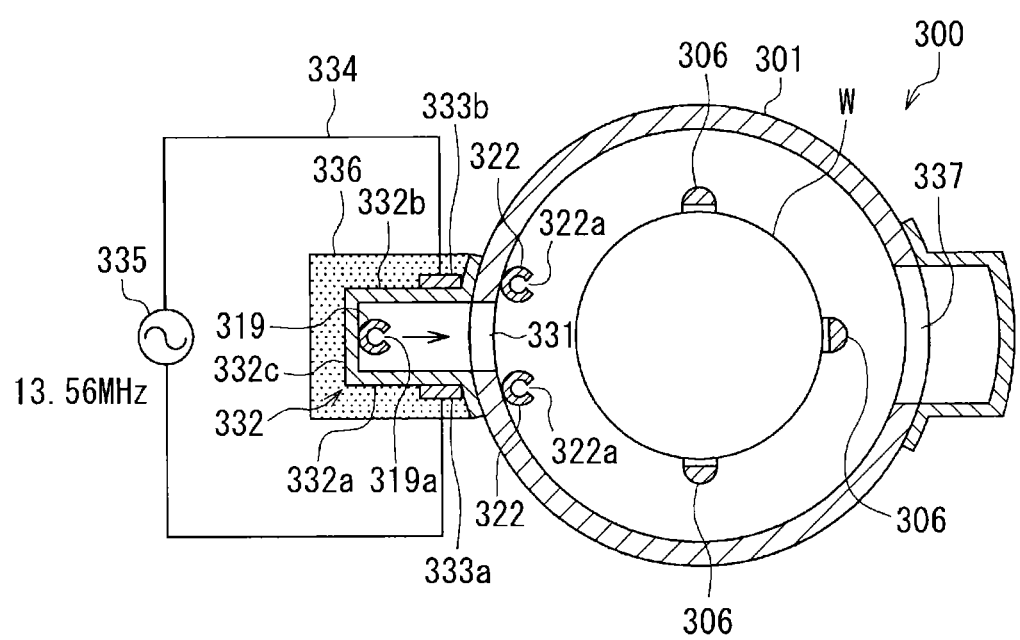
FIG. 16B is a horizontal cross-sectional view schematically showing the configuration of the film forming apparatus shown in FIG. 16A.

FIG. 16A is a vertical cross-sectional view schematically showing a configuration of a film forming apparatus 300 for use in forming the SiO$_2$ film 95 in this modification example. FIG. 16B is a horizontal cross-sectional view schematically showing a configuration of the film forming apparatus 300 employed in this modification example. Further, a heating unit has been omitted in FIG. 16B. As shown in FIGS. 16A and 16B, the film forming apparatus 300 has a cylindrical processing chamber 301 whose lower end is opened and upper end is closed. The processing chamber 301 is formed of, e.g., quartz. At the top of the processing chamber 301, there is provided a ceiling plate 302 formed of, e.g., quartz. Further, the opening of the lower end of the processing chamber 301 is connected to a manifold 303 which is formed into a cylindrical body by using, e.g., stainless steel. A seal member 304 such as O-ring is disposed at a connection portion between the processing chamber 301 and the manifold 303 to maintain airtightness.

The manifold 303 supports the lower end of the processing chamber 301. A wafer boat 305 made of quartz and capable of supporting wafers W in multiple stages is inserted into the processing chamber 301 from the bottom of the manifold 303. The wafer boat 305 has three pillars 306 (only two shown in FIG. 16A) and the wafers W are supported by using grooves (not shown) formed in the pillars 306. The wafer boat 305 is configured to support, e.g., 50 to 100 wafers W at the same time.

The wafer boat 305 is mounted on a rotary table 308 via a cylindrical body 307 made of quartz. At the opening of the lower end of the manifold 303, there is provided a bottom cover 309 made of, e.g., stainless steel in order to perform opening and closing. The rotary table 308 is supported on a rotating shaft 310 which is provided to pass through the bottom cover 309. At a through hole (not shown) of the bottom cover 309 through which the rotating shaft 310 is inserted, a magnetic fluid seal 311 is provided for example. The magnetic fluid seal 311 airtightly seals the through hole of the bottom cover 309 through which the rotating shaft 310 is inserted while allowing the rotation of the rotating shaft 310. Further, a seal member 312 such as O-ring is disposed between the periphery of the bottom cover 309 and the lower end of the manifold 303, thereby maintaining the airtightness of inside of the processing chamber 301.

The rotating shaft 310 is attached to a leading end portion of an arm 313. The arm 313 is supported by a lifting mechanism (not shown) such as a boat elevator. Accordingly, the wafer boat 305, the rotary table 308 and the bottom cover 309 are moved up and down together, and the wafer boat 305 can be inserted into or removed from the processing chamber 301. Alternatively, the rotary table 308 may be provided to be fixed on the bottom cover 309 such that the processing of the wafers W can be performed without rotating the wafer boat 305.

The film forming apparatus 300 includes an oxygen-containing gas supply unit 314 to supply an oxygen-containing gas, e.g., O$_2$ gas into the processing chamber 301, a Si-containing compound supply unit 315 to supply a Si containing compound into the processing chamber 301, and a purge gas supply unit 316 to supply a nonreactive gas, e.g., N$_2$ gas as a purge gas into the processing chamber 301.

The oxygen-containing gas supply unit 314 includes an oxygen-containing gas supply source 317, a gas supply pipe 318 through which the oxygen-containing gas is supplied from the oxygen-containing gas supply source 317, and a dispersion nozzle 319 connected to the gas supply pipe 318. The dispersion nozzle 319 is arranged to pass through a sidewall of the manifold 303 into the processing chamber 301, and is formed of a quartz tube bent upward and vertically extending in a longitudinal direction of the processing chamber 301. Gas injection holes 319a are vertically formed at predetermined intervals in the dispersion nozzle 319. The oxygen-containing gas, e.g., O$_2$ gas may be substantially uniformly injected in a horizontal direction toward the processing chamber 301 from the gas injection holes 319a.

Further, the Si-containing compound supply unit 315 includes a Si-containing compound supply source 320, a gas supply pipe 321 through which the Si-containing compound is supplied from the Si-containing compound supply source 320, and a dispersion nozzle 322 connected to the gas supply pipe 321. The dispersion nozzle 322 is provided to pass through the sidewall of the manifold 303 into the processing chamber 301, and is formed of a quartz tube bent upward and vertically extending in a longitudinal direction of the processing chamber 301. For example, two dispersion nozzles 322 are provided (see FIG. 16B), and gas injection holes 322a are vertically formed at predetermined intervals in each of the dispersion nozzles 322. The Si-containing compound may be substantially uniformly injected in a horizontal direction toward the processing chamber 301 from the gas injection holes 322a. Further, one or three or more dispersion nozzles 322 may be provided without being limited to two dispersion nozzles.

The purge gas supply unit 316 includes a purge gas supply source 323, a gas supply pipe 324 through which the purge gas is supplied from the purge gas supply source 323, and a purge gas nozzle 325 connected to the gas supply pipe 324 and provided to pass through the sidewall of the manifold 303. A nonreactive gas (e.g., N$_2$ gas) may be used as the purge gas.

Opening/closing valves 318a, 321a and 324a and flow rate controllers 318b, 321b and 324b such as mass flow controllers (MFCs) are provided in the gas supply pipes 318, 321 and 324, respectively, to supply the oxygen-containing gas, the Si-containing compound and the purge gas while controlling their flow rates.

A plasma generating unit 330 for generating a plasma of the oxygen-containing gas is provided in the processing chamber 301. The plasma generating unit 330 has an extension wall 332. A portion of the sidewall of the processing chamber 301 is cut out in a shape with a predetermined width along a vertical direction to form a vertically thin and elongated opening 331. The opening 331 is formed to be sufficiently long in a vertical direction (longitudinal direction of the processing chamber 301) to cover all the wafers W held in multiple stages in the wafer boat 305. The extension wall 332 is hermetically bonded to the wall of the processing chamber 301 to cover the opening 331 from the outside. The extension wall 332 is formed of, e.g., quartz. The extension wall 332 has a U-shaped transverse cross-section, and is formed to be thin and elongated in a vertical direction (longitudinal direction of the processing chamber 301). By providing the extension wall 332, a part of the sidewall of the processing chamber 301 is formed to extend outward and have a U-shaped transverse cross-section, and an inner space of the extension wall 332 integrally communicates with an inner space of the processing chamber 301.

Further, the plasma generating unit 330 includes a pair of thin and elongated plasma electrodes 333a and 333b, a power feed line 334 connected to the plasma electrodes 333a and 333b, and a high frequency power supply 335 for supplying a high frequency power to the pair of plasma electrodes 333a and 333b through the power feed line 334. The pair of elongated plasma electrodes 333a and 333b are arranged on the outside of facing sidewalls 332a and 332b of the extension wall 332 to face each other in a vertical direction (longitudinal direction of the processing chamber 301). Further, a plasma of the oxygen-containing gas can be generated by applying a high frequency power of, e.g., 13.56 MHz to the plasma electrodes 333a and 333b from the high frequency power supply 335. Further, the frequency of the high frequency power may be any other frequency, e.g., 400 kHz or the like without being limited to 13.56 MHz.

An insulating protection cover 336 made of, e.g., quartz is attached onto the outside of the extension wall 332 to cover the extension wall 332. Further, a coolant passage (not shown) is provided in the insulating protection cover 336 to cool the plasma electrodes 333a and 333b by allowing a coolant such as a cooled nitrogen gas to flow therein.

The dispersion nozzle 319 introducing the oxygen-containing gas into the processing chamber 301 is bent outward in a radial direction of the processing chamber 301 while extending upward in the processing chamber 301, and continuously formed to stand upward along an outermost wall 332c of the extension wall 332 (farthest from the center of the processing chamber 301). When a high frequency electric field is formed between the plasma electrodes 333a and 333b by supplying the high frequency power from the high frequency power supply 335, a plasma of the oxygen gas injected from the gas injection holes 319a of the dispersion nozzle 319 is generated, and the plasma diffuses toward the center of the processing chamber 301.

Further, the two dispersion nozzles 322 introducing the Si-containing compound into the processing chamber 301 are provided such that the opening 331 of the processing chamber 301 is located between the two dispersion nozzles 322. The Si-containing compound may be injected toward the center of the processing chamber 301 through the gas injection holes 322a formed in the dispersion nozzles 322.

Further, an exhaust opening 337 is provided on the opposite side to the opening 331 of the processing chamber 301 to evacuate the processing chamber 301 to a vacuum level. The exhaust opening 337 is formed in an elongated shape by cutting a portion of the sidewall of the processing chamber 301 in a vertical direction (longitudinal direction of the processing chamber 301). An exhaust cover 338 having a U-shaped transverse cross-section is joined and attached to the periphery of the exhaust opening 337 to cover the exhaust opening 337 by, e.g., welding. The exhaust cover 338 extends more upward than the upper end of the processing chamber 301 in a longitudinal direction of the processing chamber 301. The exhaust cover 338 is connected to a gas outlet 339 provided above the processing chamber 301. The gas outlet 339 is connected to a vacuum exhaust unit including a vacuum pump (not shown) and configured to evacuate the processing chamber 301 to a vacuum level.

A housing-shaped heating unit 340 is provided to surround the processing chamber 301 to heat the processing chamber 301 and the wafers W loaded in the processing chamber 301.

The control of each component of the film forming apparatus 300, e.g., the supply/stop of each gas by opening/closing the valves 318a, 321a and 324a, the control of gas flow rate by the flow rate controllers 318b, 321b and 324b, the on/off control of the high frequency power supply 335, the control of the heating unit 340 or the like is performed by a control unit 70B. Since a basic configuration and function of the control unit 70B are similar to the control unit 70 of the film forming apparatus 100 shown in FIG. 1, a description thereof is omitted.

In steps (STEP31, STEP41, STEP51) of forming the $SiO_2$ film of this modification example, a step of supplying the Si-containing compound gas into the processing chamber 301 and adsorbing the Si-containing compound onto the porous low-k film 91 of the wafer W by the MLD method, and a step of supplying the oxygen-containing gas into the processing chamber 301 and oxidizing the Si-containing compound are alternately repeated.

Specifically, in the step of adsorbing the Si-containing compound onto the porous low-k film 91 of the wafer W, the Si-containing compound gas is supplied into the processing chamber 301 through the dispersion nozzles 322 for a predetermined period of time. Accordingly, the Si-containing compound is adsorbed onto the porous low-k film 91.

Then, in the step of supplying the oxygen-containing gas into the processing chamber 301 and oxidizing the Si-containing compound, the oxygen-containing gas is supplied into the processing chamber 301 through the dispersion nozzle 319 for a predetermined period of time. The Si-containing compound adsorbed onto the porous low-k film 91 is oxidized by the oxygen-containing gas converted into a plasma by the plasma generating unit 330, thereby forming the $SiO_2$ film 95.

Further, when switching between the step of adsorbing the Si-containing compound onto the porous low-k film 91 of the wafer W and the step of oxidizing the Si-containing compound, a step of supplying a purge gas containing a nonreactive gas such as $N_2$ gas into the processing chamber 301 while evacuating the processing chamber 301 to a vacuum level may be performed for a predetermined period of time in order to remove a residual gas in the previous step. Further, since the gas remaining in the processing chamber 301 is preferred to be removed in this step, there may be performed a step in which vacuum evacuation is performed in a state where the supply of all the gases is stopped and the purge gas is not supplied.

In this modification example, an aminosilane-based precursor may be used as the Si-containing compound for forming the $SiO_2$ film 95. For example, bis(tertiary-butylamino)silane (BTBAS), bis(dimethylamino)silane (BDMAS), bis(diethylamino)silane (BDEAS), dimethylamino silane (DMAS), diethylamino silane (DEAS), dipropylamino silane (DPAS), butylamino silane (BAS), diisopropylamino silane (DIPAS), bis(ethylmethylamino)silane (BEMAS), tri(dimethylamino)silane (TDMAS) or the like may be an example of the aminosilane-based precursor. Further, instead of the aminosilane-based precursor, e.g., ethoxysilane-based precursor such as tetraethoxysilane (TEOS) may be also used as the Si-containing compound.

Further, as the oxygen-containing gas, for example, $O_2$ gas, NO gas, $N_2O$ gas, $H_2O$ gas, $O_3$ gas or the like may be used. The oxygen-containing gas may be used as an oxidizing agent by converting it into a plasma by a high frequency electric field.

The preferable conditions for forming the $SiO_2$ film 95 by the MLD method by using the film forming apparatus 300 are exemplified below. Further, FIG. 17 shows an example of a timing chart of the first film forming step of forming the $SiO_2$ film 95 by the MLD method.

(Preferable Film Forming Conditions by MLD Method)
(1) Si-Containing Gas Supply Conditions
Si-containing gas: DIPAS
Substrate (wafer W) temperature: No heating
Pressure in processing chamber 301: 26.7 to 667 Pa
Gas flow rate: 50 to 1000 mL/min (sccm)
Supply time: 1 to 10 seconds
(2) Oxygen-Containing Gas Supply Conditions
Oxygen-containing gas: oxygen gas
Substrate (wafer W) temperature: No heating
Pressure in processing chamber 301: 66.7 to 227 Pa
Gas flow rate: 5 to 30 L/min (slm)
Supply time: 5 to 30 seconds
Frequency of high frequency power supply: 13.56 MHz
Power of high frequency power supply: 50 to 500 W
(3) Purge Gas Supply Conditions
Purge gas: $N_2$ gas
Pressure in processing chamber 301: 0.133 to 665 Pa
Gas flow rate: 0.1 to 5000 mL/min (sccm)
Supply time: 1 to 60 seconds
(4) Repeated Condition
Total cycle: 1 to 10 cycles As described above, in the first film forming step of this modification example, the $SiO_2$ film 95 may be formed at a temperature of 3000° C. or lower by using the MLD method. In particular, by adjusting the conditions such as the pressure in the processing chamber 301, the high frequency power and the flow rate of the oxygen-containing gas to the conditions exemplified above, the $SiO_2$ film 95 can be formed at a low temperature of room temperature or 100° C. or lower. Moreover, by using the MLD method, the step coverage in the opening 93 formed in the porous low-k film 91 is also increased.

In the third modification example, since steps other than the first film forming step can be carried out in the same manner as other aspects of the third embodiment, a description thereof will be omitted.

Other configurations and effects in the film forming method of this embodiment are similar to those of the first embodiment.

<Punch-Through Step>

The first to third embodiments may include, in addition to the above steps, a punch-through step to remove an unnecessary film formed on a bottom wall of the opening. Specifically, in case of the first and the second embodiment, the punch-through step is performed so that the manganese-containing film 87 formed on the bottom wall of the opening 83 is removed while leaving the manganese-containing film 87 formed on the sidewall of the opening 83 of the insulating film 81 that is a low dielectric constant film. In case of the third embodiment, the punch-through step is performed so that the manganese-containing film 97 and the $SiO_2$ film 95 formed on the bottom wall of the opening 93 are removed while leaving the manganese-containing film 97 and the $SiO_2$ film 95 formed on the sidewall of the opening 93 of the porous low-k film 91.

Figure 18:
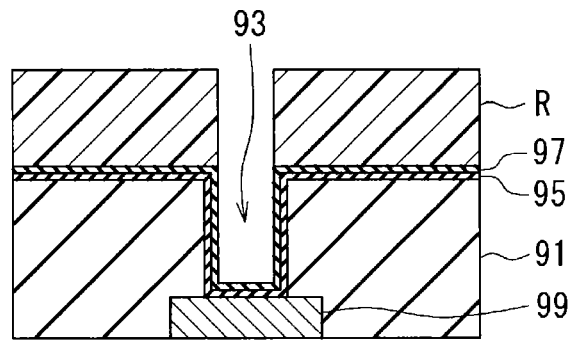
FIG. 18 is a cross-sectional view showing the main part of the surface of the wafer before a punch-through step.
Figure 19:
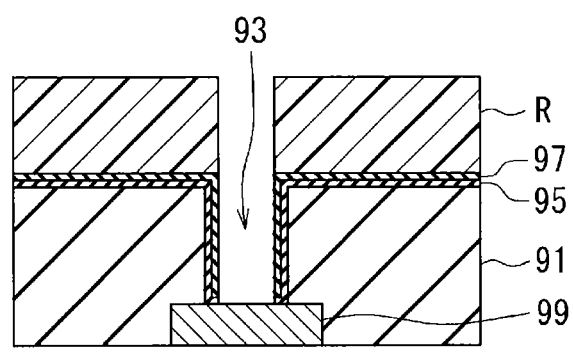
FIG. 19 is a cross-sectional view showing the main part of the surface of the wafer after the punch-through step.

FIGS. 18 and 19 illustrate an example in a case of applying the punch-through step in the third embodiment. It is preferable that the punch-through step is performed, e.g., when the opening 93 is a via hole and there is a need to expose a lower wiring 99 (not shown in FIGS. 10 to 12) at the bottom of the opening 93.

In the punch-through step, as shown in FIG. 18, after forming the manganese-containing film 97, a resist film R is patterned on the entire surface except the opening 93 by using a photolithography technique. Then, as shown in FIG. 19, the manganese-containing film 97 and the $SiO_2$ film 95 that have been deposited on the bottom wall of the opening 93 (the surface of the lower wiring 99) are selectively removed by using the resist film R as a mask. As a method of selectively removing the manganese-containing film 97 and the $SiO_2$ film 95 deposited on the bottom wall of the opening 93, for example, Ar sputtering, reactive ion etching (RIE) or the like may be used. After the manganese-containing film 97 and the $SiO_2$ film 95 are selectively removed, the resist film R is removed by a typical method.

Further, in the first and the second embodiment, the punch-through step may be carried out similarly.

Further, the manganese-containing film 97 and the $SiO_2$ film 95 deposited on the bottom wall of the opening 93 may be selectively removed by appropriately selecting, e.g., the process conditions of Ar sputtering without using the photolithography technique and the resist mask.

(Effects)

As described above in the first to third embodiments, in the present invention, the adhesion of the manganese-containing film can be improved and the manganese-containing film can be formed to have a uniform thickness in the opening with good step coverage by directly introducing the Si—OH groups to the surface of the low dielectric constant film, or indirectly introducing the Si—OH groups through the $SiO_2$ film. Further, the presence of the Si—OH groups makes it possible to improve the film forming rate of the manganese-containing film, thereby forming the manganese-containing film having a desired film thickness.

(Application Examples to Damascene Process)

Figure 20:
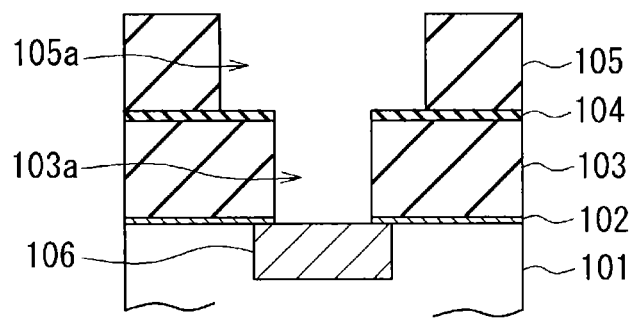
FIG. 20 is a cross-sectional view of the surface of the wafer in a case where the film forming method in accordance with the first embodiment of the present invention is applied to a damascene process.

Next, an application example in which the film forming method of the first embodiment is applied to a damascene process will be described with reference to FIGS. 20 to 23. FIG. 20 is a cross-sectional view of a main part of the wafer W showing a laminated body before forming the manganese-containing film 87. An etching stopper film 102, an interlayer insulating film 103 being a via layer, an etching stopper film 104, and an interlayer insulating film 105 being a wiring layer are formed in this order on an interlayer insulating film 101 being a base wiring layer. Further, a lower wiring 106 in which Cu has been embedded is formed in the interlayer insulating film 101. Further, each of the etching stopper films 102 and 104 has a barrier function to prevent copper diffusion. Each of the interlayer insulating film 103 and 105 is a low dielectric constant film formed by, e.g., a CVD method.

The etching stopper films 102 and 104 are formed of silicon carbide (SiC), silicon nitride (SiN), silicon carbide nitride (SiCN) or the like by, e.g., a CVD method.

As shown in FIG. 20, openings 103a and 105a are formed in a predetermined pattern in the interlayer insulating films 103 and 105, respectively. The openings 103a and 105a may be formed by etching the interlayer insulating films 103 and 105 by using a photolithography technique based on a typical method. The opening 103a is, e.g., a via hole, and the opening 105a is, e.g., a wiring groove. The opening 105a reaches the upper surface of the etching stopper film 104, and the opening 103a reaches the upper surface of the lower wiring 106.

Figure 21:
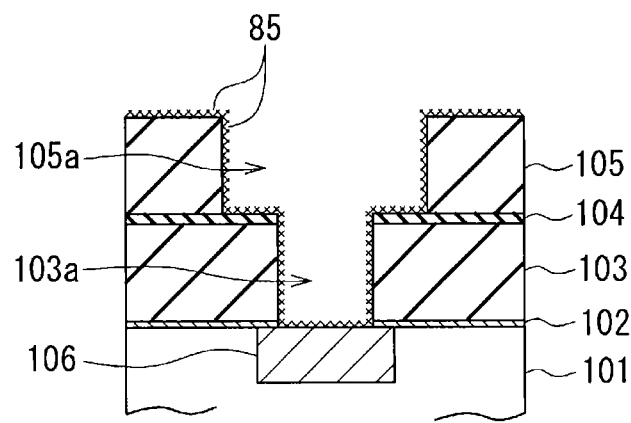
FIG. 21 is a cross-sectional view of the main part of the surface of the wafer showing a state after a surface modification in a subsequent step after the step shown in FIG. 20.

FIG. 21 shows a state after the surface modification step is performed on the structure shown in FIG. 20 by using the film forming apparatus 100. By performing the surface modification step, the Si—OH groups 85 are formed on the surfaces of the interlayer insulating films 103 and 105 including the inner surfaces of the openings 103a and 105a. Further, in the surface modification process, the Si-containing compound gas and the OH group-donating gas may be allowed to act alternately or simultaneously on the interlayer insulating films 103 and 105.

Figure 22:
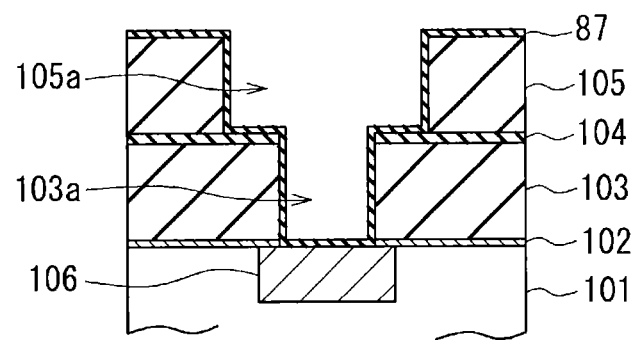
FIG. 22 is a cross-sectional view of the main part of the surface of the wafer showing a state where a manganese-containing film is formed in a subsequent step after the step shown in FIG. 21.

Next, FIG. 22 shows a state after the film forming step is performed on the structure shown in FIG. 21 to form the manganese-containing film 87 by a CVD method by using the film forming apparatus 100. In the film forming step, since the Si—OH groups 85 are formed on the surfaces of the underlying interlayer insulating films 103 and 105, the adhesion of the manganese-containing film 87 is improved, and good step coverage is obtained with a uniform film thickness even if the openings 103a and 105a have a high aspect ratio.

As described above, the surface modification step and the film forming step can also be carried out repeatedly. Further, although not shown, by performing the punch-through step in the state shown in FIG. 22, the manganese-containing film 87 formed on the bottom of the opening 103a can be selectively removed only.

Figure 23:
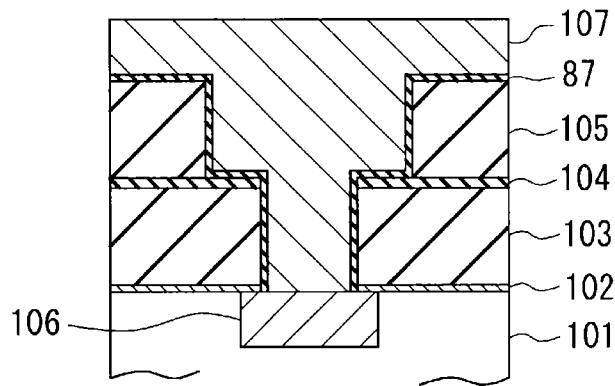
FIG. 23 is a cross-sectional view of the main part of the surface of the wafer showing a state where a Cu film is filled in a subsequent step after the step of FIG. 22.

Then, as shown in FIG. 23, Cu is deposited from the top of the interlayer insulating film 105 to form a Cu film 107, thereby filling up the openings 103a and 105a. The Cu film 107 may be formed by, e.g., a CVD method, a PVD method, a plating method or the like. The Cu film 107 filled in the opening 103a becomes a Cu plug, and the Cu film 107 filled in the opening 105a becomes a Cu wiring. Then, by performing a typical method, a planarization is performed by a chemical mechanical polishing (CMP) method to remove the extra Cu film 107, thereby fabricating a multilayer wiring structure including the Cu plug and the Cu wiring. Further, by performing the punch-through step, the manganese-containing film 87 formed on the bottom of the opening 103a is removed, thereby ensuring an electrical contact between the lower wiring 106 and the Cu film 107 filled in the openings 103a and 105a.

In the multilayer wiring structure formed as described above, the manganese-containing film 87 has an excellent barrier function, and thus it is possible to suppress the diffusion of Cu into the interlayer insulating films 103 and 105 from the Cu film 107. Therefore, it is possible to manufacture an electronic component with a multilayer wiring structure having excellent reliability.

With regard to the application of applying the film forming method of the second embodiment to a damascene process, a detailed description will be omitted. However, the second embodiment may be applied to a damascene process in the same procedure as described above except that the Si-containing compound gas, the OH group-donating gas, and the gas of the manganese-containing material are supplied simultaneously to perform the film forming process by a CVD method without distinction between the surface modification step and the film forming step in the first embodiment.

Figure 24:
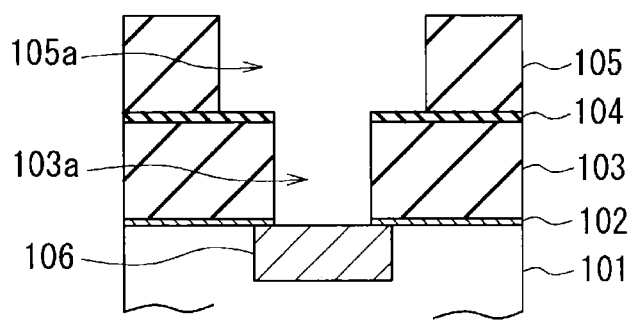
FIG. 24 is a cross-sectional view of the surface of the wafer in a case where the film forming method in accordance with the third embodiment of the present invention is applied to a damascene process.

Next, an application example in which the film forming method of the third embodiment is applied to a damascene process will be described with reference to FIGS. 24 to 27. FIG. 24 is a cross-sectional view of a main part of the wafer W showing a laminated body before forming the manganese-containing film 97, which is a structure having the same configuration as that shown in FIG. 20.

Figure 25:
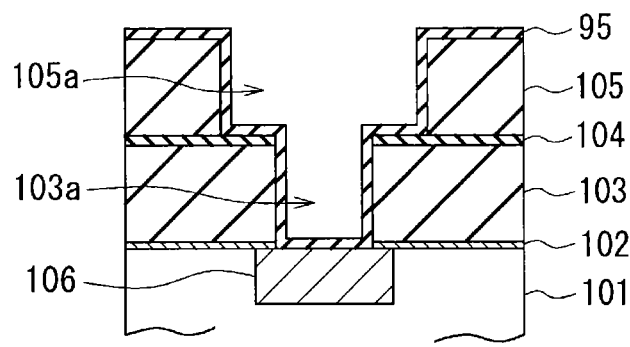
FIG. 25 is a cross-sectional view of the main part of the surface of the wafer showing a state where a $SiO_2$ film is formed in a subsequent step after the step shown in FIG. 25.

FIG. 25 shows a state after the $SiO_2$ film 95 is formed by performing the first film forming step on the structure shown in FIG. 24 by using the plasma film forming apparatus 200 or the film forming apparatus 300. By performing the film forming process of the $SiO_2$ film 95, the $SiO_2$ film 95 is formed on the surfaces of the interlayer insulating films 103 and 105 including the inner surfaces of the openings 103a and 105a. Further, the step of exposing the $SiO_2$ film 95 in the state of FIG. 25 to the atmosphere or the step of bringing the $SiO_2$ film 95 into contact with the water vapor may be carried out (see FIG. 14 or FIG. 15).

Figure 26:
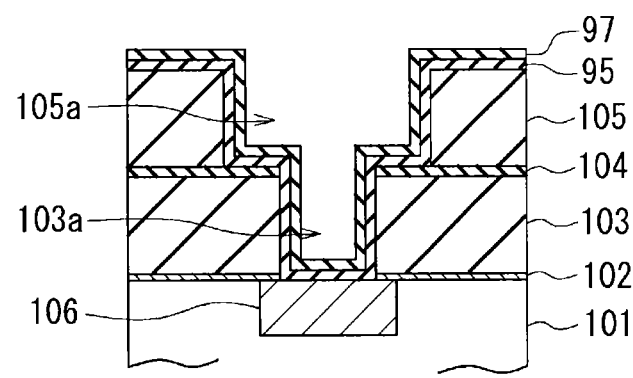
FIG. 26 is a cross-sectional view of the main part of the surface of the wafer showing a state where a manganese-containing film is formed in a subsequent step after the step shown in FIG. 25.

Next, FIG. 26 shows a state after the second film forming step is performed on the structure of FIG. 25 by using the film forming apparatus 100 and the manganese-containing film 97 is formed by a CVD method. In the second film forming step, moisture or Si—OH groups are contained in the underlying $SiO_2$ film 95, so that the adhesion of the manganese-containing film 97 is improved, and good step coverage is obtained with a uniform film thickness even if the openings 103a and 105a have a high aspect ratio.

Further, as described above, by performing the punch-through step from the state shown in FIG. 26, the $SiO_2$ film 95 and the manganese-containing film 97 formed on the bottom of the opening 103a can be selectively removed.

Figure 27:
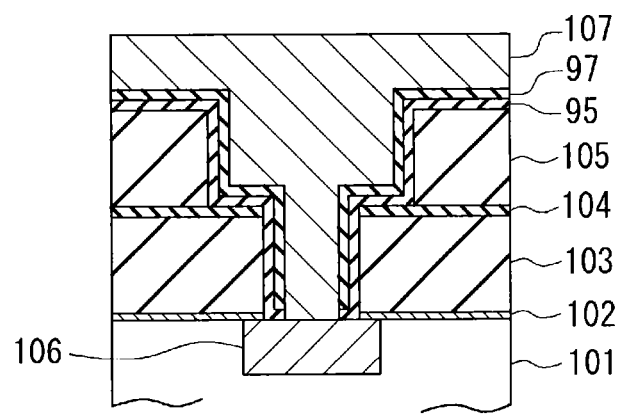
FIG. 27 is a cross-sectional view of the main part of the surface of the wafer showing a state where a Cu film is filled in a subsequent step after the step shown in FIG. 26.

Then, as shown in FIG. 27, Cu is deposited from the top of the interlayer insulating film 105 to form the Cu film 107, thereby filling up the openings 103a and 105a. The Cu film 107 may be formed by, e.g., a CVD method, a PVD method, a plating method or the like. The Cu film 107 filled in the opening 103a becomes a Cu plug, and the Cu film 107 filled in the opening 105a becomes a Cu wiring. Then, by performing a typical method, a planarization is performed by a chemical mechanical polishing (CMP) method to remove the extra Cu film 107, thereby fabricating a multilayer wiring structure including the Cu plug and Cu wiring. Further, by performing the punch-through step, the $SiO_2$ film 95 and the manganese-containing film 97 formed on the bottom of the opening 103a are removed, thereby ensuring an electrical contact between the lower wiring 106 and the Cu film 107 filled in the openings 103a and 105a.

In the multilayer wiring structure formed as described above, the manganese-containing film 97 has an excellent barrier function, and thus it is possible to suppress the diffusion of Cu into the interlayer insulating films 103 and 105 from the Cu film 107. Further, by forming the $SiO_2$ film 95 before forming the manganese-containing film 97, even if each of the interlayer insulating films 103 and 105 is a porous low-k film, it is possible to prevent Mn from entering into pores of the porous low-k film and effectively suppress the diffusion of Cu into the film. Therefore, it is possible to manufacture an electronic component with a multilayer wiring structure having excellent reliability.

In the above description, although the examples of applying the film forming method to a dual damascene process have been described, it is also applicable to a single damascene process.

Although the embodiments of the present invention have been described, the present invention is not limited to the above embodiments, and various modifications can be made. For example, although a case of using the TEOS (Si-containing compound gas) and the water vapor (OH group-donating gas) in combination for the surface modification has been exemplified in the above-described embodiments, other types of Si-containing compound gas can also be used. Further, instead of a combination of the Si-containing compound gas and the OH group-donating gas, a compound gas having OH groups and silicon atoms may be used alone.

Further, in the above-described embodiments, a thermal CVD apparatus has been used as the film forming apparatus 100, but a CVD apparatus such as a plasma CVD apparatus may be used. Furthermore, in the third embodiment, instead of the parallel plate type plasma film forming apparatus 200, a plasma processing apparatus such as radial line slot antenna (RLSA) type, ICP type, ECR plasma type, surface reflection wave plasma type, and magnetron plasma type may be used.

Further, in the above embodiments, as the structure of the laminated insulating film, the structure in which the etching stopper film 102, the interlayer insulating film 103 being a via layer, the etching stopper film 104, and the interlayer insulating film 105 being a wiring layer are formed in this order has been described as an example, but the laminated insulating film may have other structures. For example, the etching stopper film 104 may not be provided. Further, at the top of the interlayer insulating film 105, a film made of, e.g., silicon dioxide ($SiO_2$), silicon carbide (SiC), silicon nitride (SiN), silicon carbide nitride (SiCN) or the like may be provided as a hard mask film.

Further, in the above-described embodiments, as a substrate that is an object to be processed, a semiconductor wafer has been described as an example. However, without being limited thereto, the present invention can be applied to, e.g., a glass substrate, an LCD substrate, a ceramic substrate or the like.

This international application claims priority to Japanese Patent Application No. 2010-58592 filed on Mar. 16, 2010 and Japanese Patent Application No. 2011-23031 filed on Feb. 4, 2011, the entire contents of which are incorporated herein by reference.

What is claimed is:

1. A film forming method comprising:
arranging an object to be processed, on which an insulating film is formed, in a processing chamber of a film forming apparatus;
supplying a compound gas containing silicon atoms and an OH group-donating gas, or a compound gas containing silicon atoms and OH groups into the processing chamber so that Si—OH groups are formed on a surface of the insulating film, wherein only the Si—OH groups are substantially formed on the surface of the insulating film and wherein the Si—OH groups are formed on only the surface of the insulating film without increasing dielectric constant; and
supplying a film forming gas including a manganese-containing material into the processing chamber so that a manganese-containing film made of MnOx is formed by CVD on the surface of the insulating film on which the Si—OH groups have been formed.

2. The film forming method of claim 1, wherein the compound gas containing silicon atoms and the OH group-donating gas are supplied into the processing chamber simultaneously.

3. The film forming method of claim 1, wherein the compound gas containing silicon atoms and the OH group-donating gas are supplied into the processing chamber alternately.

4. The film forming method of claim 1, wherein said supplying the compound gas containing silicon atoms and the OH group-donating gas, or the compound gas containing silicon atoms and OH groups and said supplying the film forming gas including the manganese-containing material are repeated alternately to obtain a desired film thickness.

5. The film forming method of claim 1, wherein the insulating film is a low dielectric constant film having a predetermined irregularity pattern.

6. The film forming method of claim 5, further comprising removing the manganese-containing film formed on a bottom wall of an opening of the low dielectric constant film having the predetermined irregularity pattern while leaving the manganese-containing film formed on a sidewall of the opening.

7. The film forming method of claim 1, wherein the compound gas containing silicon atoms is a gas including at least one selected from the group consisting of tetraethoxysilane (TEOS), tetramethoxysilane, tetra-i-propoxysilane, tetra-n-propoxysilane, tetra-i-butoxysilane, tetra-n-butoxysilane, tetra-sec-butoxysilane, tetra-tert-butoxysilane, tris(tert-butoxy)silanol, tris(tert-pentoxy)silanol, tris(isopropoxy)silanol, bis(tert-butoxy)silanediol, tetra(tert-butoxy)silane, monosilane, disilane, trisilane and tetrasilane.

8. The film forming method of claim 1, wherein the OH group-donating gas is water vapor or alcohol.

9. The film forming method of claim 1, wherein the compound gas containing silicon atoms and OH groups is a gas including at least one selected from the group consisting of tris(tert-butoxy)silanol, tris(tert-pentoxy)silanol, tris(isopropoxy)silanol and bis(tert-butoxy)silanediol.

10. The film forming method of claim 1, wherein a cyclopentadienyl-based precursor is used as the manganese-containing material.

11. The film forming method of claim 10, wherein the cyclopentadienyl-based precursor is at least one selected from the group consisting of $Mn(C_5H_5)_2$, $Mn(CH_3C_5H_4)_2$, $Mn(C_2H_5C_5H_4)_2$, $Mn(C_3H_7C_5H_4)_2$, $(CH_3C_5H_4)Mn(CO)_3$, $Mn(C_4H_9C_5H_4)_2$ and $Mn((CH_3)_5C_5H_4)_2$.

12. The film forming method of claim 1, wherein said supplying the compound gas containing silicon atoms and the OH group-donating gas, or the compound gas containing silicon atoms and OH groups and said supplying the film forming gas including the manganese-containing material are carried out simultaneously.

13. The film forming method of claim 12, wherein the insulating film is a low dielectric constant film having a predetermined irregularity pattern.

14. The film forming method of claim 13, further comprising removing the manganese-containing film formed on a bottom wall of an opening of the low dielectric constant film having the predetermined irregularity pattern while leaving the manganese-containing film formed on a sidewall of the opening.

15. The film forming method of claim 12, wherein the compound gas containing silicon atoms is a gas including at least one selected from the group consisting of tetraethoxysilane (TEOS), tetramethoxysilane, tetra-i-propoxysilane, tetra-n-propoxysilane, tetra-i-butoxysilane, tetra-n-butoxysilane, tetra-sec-butoxysilane, tetra-tert-butoxysilane, tris(tert-butoxy)silanol, tris(tert-pentoxy)silanol, tris(isopropoxy)silanol, bis(tert-butoxy)silanediol, tetra(tert-butoxy)silane, monosilane, disilane, trisilane and tetrasilane.

16. The film forming method of claim 12, wherein the OH group-donating gas is water vapor or alcohol.

17. The film forming method of claim 1, wherein said supplying the compound gas containing silicon atoms and the OH group-donating gas, or the compound gas containing silicon atoms and OH groups are carried out intermittently, and said supplying the film forming gas including the manganese-containing material are carried out continuously.

18. The film forming method of claim 17, wherein the insulating film is a low dielectric constant film having a predetermined irregularity pattern.

19. The film forming method of claim 17, further comprising a step of removing the manganese-containing film formed on a bottom wall of an opening of the low dielectric constant film having the predetermined irregularity pattern while leaving the manganese-containing film formed on a sidewall of the opening.

20. The film forming method of claim 1, wherein said supplying the compound gas containing silicon atoms and the OH group-donating gas, or the compound gas containing silicon atoms and OH groups and said supplying the film forming gas including the manganese-containing material are carried out sequentially in that order.

\* \* \* \* \*